United States Patent
Yang et al.

(10) Patent No.: US 11,372,065 B2
(45) Date of Patent: Jun. 28, 2022

(54) METHOD TO ISOLATE RESONANT RADIO FREQUENCY (RF) COILS

(71) Applicant: Quality Electrodynamics, LLC, Mayfield Village, OH (US)

(72) Inventors: Xiaoyu Yang, Indiana, PA (US); Tsinghua Zheng, Chesterland, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 0 days.

(21) Appl. No.: 17/151,307

(22) Filed: Jan. 18, 2021

(65) Prior Publication Data

US 2021/0247476 A1    Aug. 12, 2021

Related U.S. Application Data

(60) Provisional application No. 62/971,641, filed on Feb. 7, 2020.

(51) Int. Cl.
*G01R 33/421*    (2006.01)
*G01R 33/36*    (2006.01)

(52) U.S. Cl.
CPC ..... *G01R 33/4215* (2013.01); *G01R 33/3628* (2013.01); *G01R 33/3642* (2013.01)

(58) Field of Classification Search
CPC ............ G01R 33/4215; G01R 33/3628; G01R 33/3642
See application file for complete search history.

(56) References Cited

U.S. PATENT DOCUMENTS

| 4,820,985 A * | 4/1989 | Eash ................. G01R 33/3628 324/318 |
| 4,825,162 A | 4/1989 | Roemer et al. |
| 7,091,721 B2 | 8/2006 | Jevtic |
| 2006/0250125 A1 * | 11/2006 | Bogdanov ........ G01R 33/34046 324/200 |

(Continued)

OTHER PUBLICATIONS

Roemer et al. "The NMR Phased Array." Magnetic Resonance in Medicine, 16, 192-225 (1990), published in 1990.

(Continued)

*Primary Examiner* — Dixomara Vargas
(74) *Attorney, Agent, or Firm* — Eschweiler & Potashnik, LLC

(57) ABSTRACT

Various embodiments of the present disclosure are directed towards a radio frequency (RF) coil comprising a first combination coil and a second combination coil. The first combination coil comprises a first resonant coil and a first resonant shield coupled inductively or by a capacitor, and the first combination coil has a first resonant frequency and a second resonant frequency. The second combination coil comprises a second resonant coil and a second resonant shield coupled inductively or by a capacitor, and the second combination coil has a third resonant frequency and a fourth resonant frequency. The first and second resonant coils are inductively coupled to each other and respectively to the second and first resonant shields. The first and third resonant working frequencies are the same, and the second and fourth resonant isolation frequencies are such that inductive coupling between the first and second resonant coils is negated.

20 Claims, 16 Drawing Sheets

(56) References Cited

U.S. PATENT DOCUMENTS

| | | | | |
|---|---|---|---|---|
| 2010/0244835 A1* | 9/2010 | McKinnon | | G01R 33/422 |
| | | | | 324/318 |
| 2011/0043208 A1* | 2/2011 | Leussler | | G01R 33/3415 |
| | | | | 324/318 |
| 2011/0175616 A1* | 7/2011 | Ochi | | G01R 33/422 |
| | | | | 324/318 |
| 2011/0312499 A1* | 12/2011 | Vaughan | | G01R 33/365 |
| | | | | 324/322 |
| 2016/0284465 A1* | 9/2016 | Maniktala | | H02J 50/12 |
| 2018/0143280 A1* | 5/2018 | Dyvorne | | G01R 33/48 |
| 2018/0224512 A1* | 8/2018 | Poole | | G01R 33/383 |
| 2018/0238978 A1* | 8/2018 | McNulty | | G01R 33/365 |
| 2018/0275227 A1* | 9/2018 | Song | | G01R 33/3415 |
| 2020/0355768 A1* | 11/2020 | Bindseil | | A61B 5/055 |

OTHER PUBLICATIONS

Wang, Jianmin. "A Novel Method to Reduce the Signal Coupling of Surface Coils for MRI." Proc. ISMRM 4:1434 (1996), published in 1996.

\* cited by examiner

METHOD TO ISOLATE RESONANT RADIO FREQUENCY (RF) COILS

REFERENCE TO RELATED APPLICATION

This application claims the benefit of U.S. Provisional Application No. 62/971,641, filed on Feb. 7, 2020, the contents of which are incorporated by reference in their entirety.

BACKGROUND

Magnetic resonance imaging (MRI) involves the transmission and receipt of radio frequency (RF) energy. RF energy for MRI may be transmitted and received by RF coils. RF coils employed for transmitting RF energy may be referred to as transmit (Tx) coils, and RF coils employed for receiving RF energy may be referred to as receive (Rx) coils. Further, RF coils employed for transmitting and receiving RF energy may be referred to Tx/Rx coils.

Phased array technology is an approach to build a multiple-channel Rx coil comprising multiple coil elements. Such a multiple-channel Rx coil may also be known as a phased array Rx coil. Phased array Rx coils are widely used because the coils provide the signal penetration of large Rx coils while also providing the high signal performance of small Rx coils at shallow depths. To achieve good performance, isolation between the coil elements is important.

An approach for achieving isolation between coil elements is to overlap neighboring coil elements so as to minimize mutual inductance between the coil elements. Further, preamplifiers may have low input impedance and may create high impedance points in the coil elements. This reduces current flow and hence magnetic fields for further isolation. Besides the foregoing approaches for isolation, a capacitor or a capacitor ladder may be used to achieve isolation. The ladder may isolate as many as nine coil elements.

Parallel transmission technology is an approach to build a multiple-channel Tx coil comprising multiple coil elements. Such a multiple-channel Tx coil may also be known as a parallel Tx (pTx) coil. Like phased array Rx coils, pTx coils depend upon isolation between the coil elements. However, this may be more challenging for pTx coils. Coil elements may be overlapped as described above. However, RF amplifiers often have high output impedances of 50 Ohm or more, such that there is no further isolation from the RF amplifiers. This is to be contrasted with the further isolation from the preamplifiers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
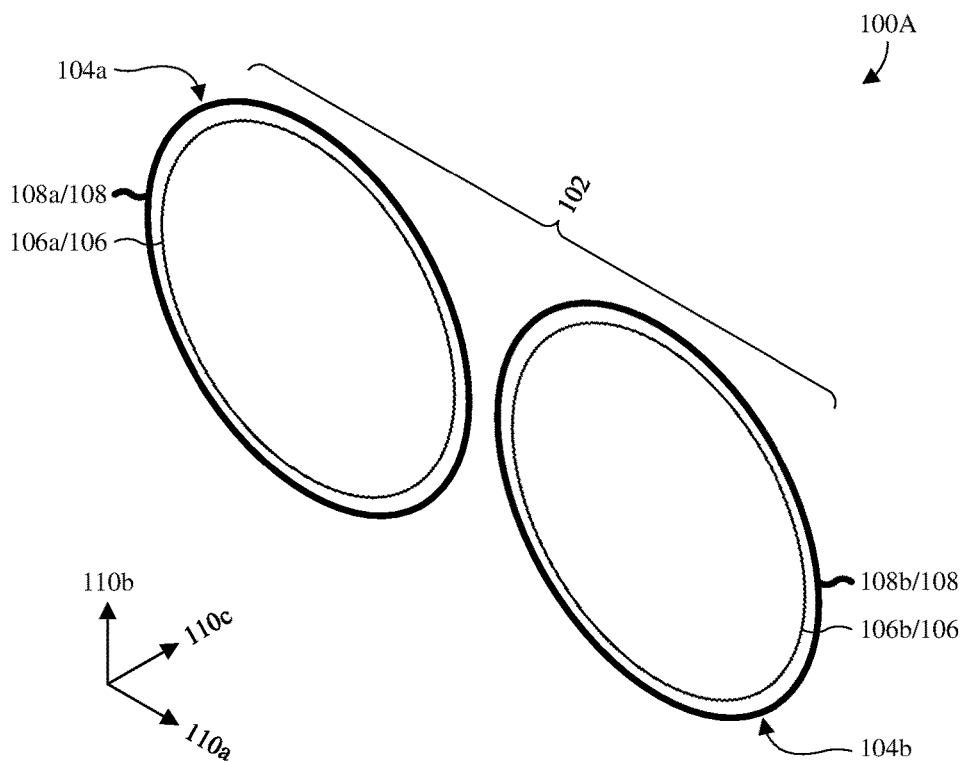
FIGS. 1A and 1B provide various views of some embodiments of a multiple-channel RF coil with enhanced inter-channel isolation according to aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the present disclosure are directed towards a method to isolate resonant radio frequency (RF) coils, as a well as a multiple-channel RF coil in which channels are isolated according to the method. The method and the multiple-channel RF coil may, for example, be applied to MRI and other suitable RF applications. Further, the multiple-channel RF coil may, for example, be employed as a phased array receive coil and/or a parallel transmission coil.

In some embodiments, the multiple-channel RF coil comprises a first combination coil and a second combination coil. The first combination coil comprises a first resonant coil and a first resonant shield coupled to each other inductively or by a first capacitor. The second combination coil comprises a second resonant coil and a second resonant shield coupled to each other inductively or by a second capacitor. The first and second resonant coils are inductively coupled to each other and respectively to the second and first resonant shields. By pairing the first and second resonant coils respectively with the first and second resonant shields, the resulting first and second combination coils each have two resonant frequencies. The two resonant frequencies of the first combination coil correspond to a first resonant working frequency and a first resonant isolation frequency, and the two resonant frequencies of correspond to a second resonant working frequency and a second resonant isolation frequency.

It has been appreciated that the first and second resonant working frequencies may be used for operation of the multiple-channel RF coil. For example, the first and second resonant working frequencies may be tuned to a suitable Larmor frequency for MRI. Further, it has been appreciated that the first and second resonant isolation frequencies may be tuned to negate or otherwise reduce the inductive coupling between the first and second combination coils. Such isolation is less sensitive to the relative positioning of the first and second combination coils than other approaches to isolation and may be used with the other approaches to isolation.

Figure 1B:
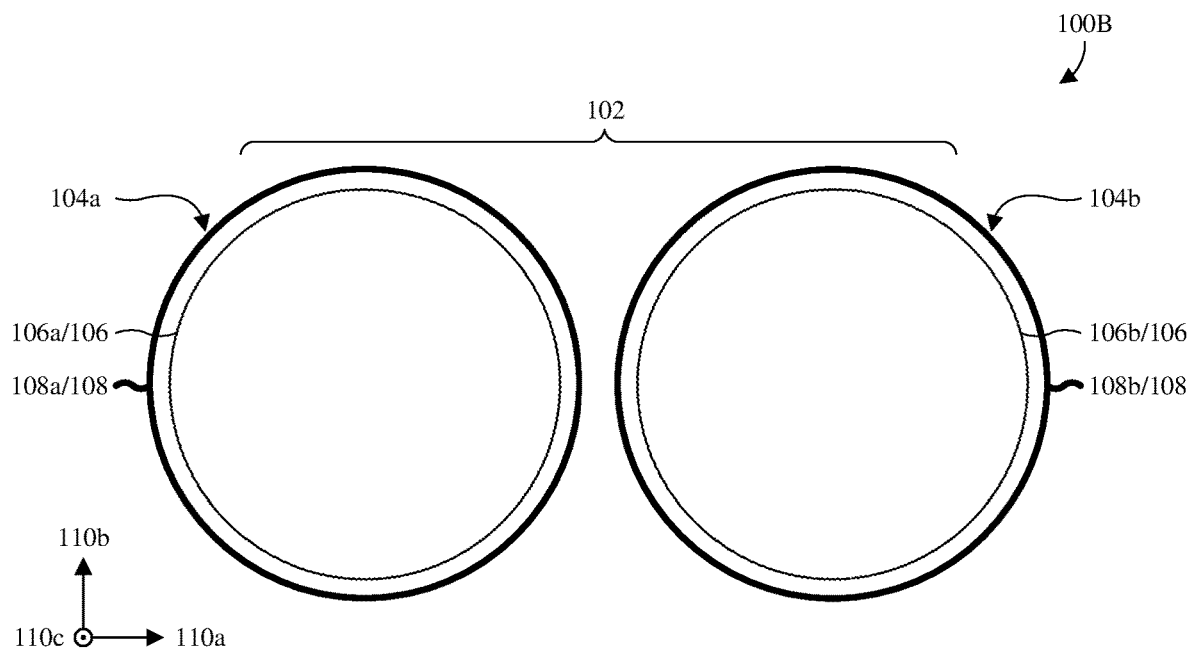

With reference to FIGS. 1A and 1B, various views 100A, 100B of some embodiments of a multiple-channel RF coil 102 with enhanced inter-channel isolation according to aspects of the present disclosure is provided. FIG. 1A illustrates a perspective view 100A of some embodiments of the multiple-channel RF coil 102, whereas FIG. 1B illustrates a side view 100B of some embodiments of the multiple-channel RF coil 102. The multiple-channel RF coil 102 may, for example, be applied to MRI and other suitable RF applications. When used for MRI, the multiple-channel RF coil 102 may, for example, be used as a receive coil, a transmit coil, or both. In some embodiments, the multiple-channel RF coil 102 is a phased array receive coil. In other embodiments, the multiple-channel RF coil 102 is a parallel transmit coil.

A first combination coil 104a and a second combination coil 104b correspond to individual channels of the multiple-channel RF coil 102. The first and second combination coils 104a, 104b border, such that the first and second combination coils 104a, 104b are inductively coupled. Further, the first and second combination coils 104a, 104b comprise individual resonant coils 106 and individual resonant shields 108. Particularly, the first combination coil 104a comprises a first resonant coil 106a and a first resonant shield 108a, and the second combination coil 104b comprises a second resonant coil 106b and a second resonant shield 108b. Note that only the general shapes of the resonant coils 106 and the resonant shields 108 are shown for ease of illustration. Capacitors and other components are omitted. Further, the resonant shields 108 have a greater line weight than the resonant coils 106 for clarity.

The first resonant coil 106a is inductively coupled to the first resonant shield 108a, and the second resonant coil 106b is inductively coupled to the second resonant shield 108b. In other embodiments, the first resonant coil 106a is coupled to the first resonant shield 108a by a capacitor and/or the second resonant coil 106b is coupled to the second resonant shield 108b by a capacitor. Further, the first resonant coil 106a and the first resonant shield 108a are each inductively coupled to the second resonant coil 106b and the second resonant shield 108b.

The resonant coils 106 and the resonant shields 108 have individual resonant frequencies that are independently tunable. An individual resonant frequency of a resonant coil or shield corresponds to a resonant frequency of the resonant coil or shield while the resonant coil or shield is in isolation without any coupling to other coils. Further, the individual resonant frequencies of the first resonant coil 106a and the first resonant shield 108a are different, and the individual resonant frequencies of the second resonant coil 106b and the second resonant shield 108b are different. In some embodiments, the resonant coils 106 and the resonant shields 108 are LC coils. In such embodiments, the resonant coils 106 and the resonant shields 108 each have an individual resonant frequency equal to $$\frac{1}{\sqrt{LC}},$$

where L and C correspond to an individual inductance and an individual capacitance of the resonant coil or shield.

Because of the inductive coupling between the resonant coils 106 and the resonant shields 108, the first and second combination coils 104a, 104b each have multiple resonant frequencies different than the individual resonant frequencies of the resonant coils 106 and the resonant shields 108. Particularly, the first combination coil 104a has a first resonant working frequency and a first resonant isolation frequency, and the second combination coil 104b has a second resonant working frequency and a second resonant isolation frequency. The first and second resonant working frequencies are predominantly defined by first and second resonant coils 106a, 106b, respectively, and the first and second resonant isolation frequencies are predominantly defined by the first and second resonant shields 108a, 108b, respectively.

It has been appreciated that the multiple resonant frequencies of the first and second combination coils 104a, 104b may be independently tuned to negate inductive coupling between the first and second combination coils 104a, 104b. Particularly, the first and second resonant working frequencies may be tuned to a common frequency used for operation of the multiple-channel RF coil 102. For example, the first and second resonant working frequencies may be tuned to a suitable Larmor frequency for MRI. Further, the first and second resonant isolation frequencies may be tuned to negate or minimize the inductive coupling between the first and second combination coils 104a, 104b. In some embodiments, the tuning is achieved by adjusting capacitors (not shown) of the first and second combination coils 104a, 104b.

As will be seen hereafter, tuning the multiple resonant frequencies to negate or minimize inductive coupling changes current ratios of the first and second combination coils 104a, 104b. Tuning a difference between the first resonant working frequency and the first resonant isolation frequency adjusts the current ratio between the first resonant coil 106a and the first resonant shield 108a. This, in turn, negates or minimizes voltages inductively induced in the second resonant coil 106b respectively by the first resonant coil 106a and the first resonant shield 108a to negate or minimize inductive coupling at the second resonant coil 106b. For example, a voltage inductively induced in the second resonant coil 106b by the first resonant coil 106a may have a same or substantially the same magnitude and an opposite sign as a voltage inductively induced in the second resonant coil 106b by the first resonant shield 108a, such that the voltages wholly or mostly cancel each other. Further, tuning the second resonant working frequency and the second resonant isolation frequency adjusts the current ratio between the second resonant coil 106b and the second resonant shield 108b. This, in turn, negates or minimizes voltages inductively induced in the first resonant coil 106a respectively by the second resonant coil 106b and the second resonant shield 108b to negate or minimize inductive coupling at the first resonant coil 106a. For example, a voltage inductively induced in the first resonant coil 106a by the second resonant coil 106b may have a same or substantially the same magnitude and an opposite sign as a voltage inductively induced in the first resonant coil 106a by the second resonant shield 108b, such that the voltages wholly or mostly cancel each other.

With continued reference to FIGS. 1A and 1B, the first and second combination coils 104a, 104b are the same in terms of at least size, shape, and layout. In some alternative embodiments, the first and second combination coils 104a, 104b are different in terms of size, shape, layout, or any combination of the foregoing. For example, the first and second resonant coils 106a, 106b may have different sizes and/or shapes and/or the first and second resonant shields 108a, 108b may have different sizes and/or shapes.

The resonant shields 108 respectively surround the resonant coils 106. In some alternative embodiments, the resonant coils 106 respectively surround the resonant shields 108. The resonant coils 106 and the resonant shields 108 are loop shaped, and the resonant coils 106 are respectively concentric with the resonant shields 108. In some alternative embodiments, the resonant coils 106 and the resonant shields 108 have a different shape. For example, the resonant coils 106 and the resonant shields 108 may have a saddle shape, a birdcage shape, or some other suitable shape. Further, in some alternative embodiments, centers of the resonant coils 106 are offset respectively from centers of the resonant shields 108.

The first resonant coil 106a and the first resonant shield 108a have a same shape, and the first resonant coil 106a is smaller than the first resonant shield 108a. In some alternative embodiments, the first resonant coil 106a has a different shape than the first resonant shield 108a and/or the first resonant coil 106a is larger than the first resonant shield 108a. Similarly, the second resonant coil 106b and the second resonant shield 108b have a same shape, and the second resonant coil 106b is smaller than the second resonant shield 108b. In some alternative embodiments, the second resonant coil 106b has a different shape than the second resonant shield 108b and/or the second resonant coil 106b is larger than the second resonant shield 108b.

The first resonant shield 108a and the first resonant coil 106a are in a common plane, and the second resonant shield 108b and the second resonant coil 106b are in the common plane. The common plane may, for example, extend in a first dimension 110a and a second dimension 110b orthogonal to the first dimension 110a. In some alternative embodiments, the first resonant shield 108a and the first resonant coil 106a are in separate planes extending in the first and second dimensions 110a, 110b and/or are laterally offset in a third dimension 110c orthogonal to the first and second dimensions 110a, 110b. In some alternative embodiments, the second resonant shield 108b and the second resonant coil 106b are in separate planes extending in the first and second dimensions 110a, 110b and/or are laterally offset in the third dimension 110c.

Figure 2:
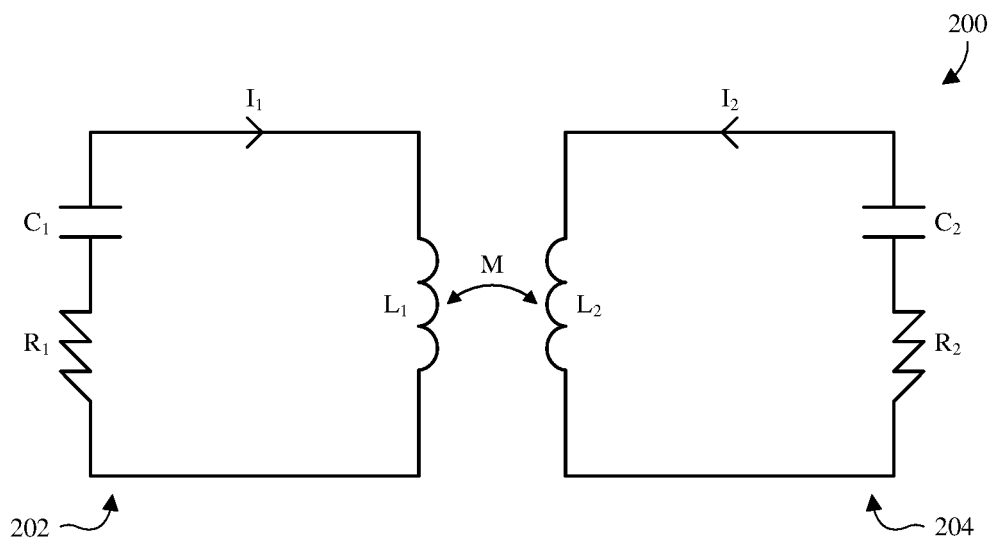
FIGS. 2-4 provide various circuit diagrams to illustrate a method for isolating first and second combination coils of FIGS. 1A and 1B.
Figure 3:
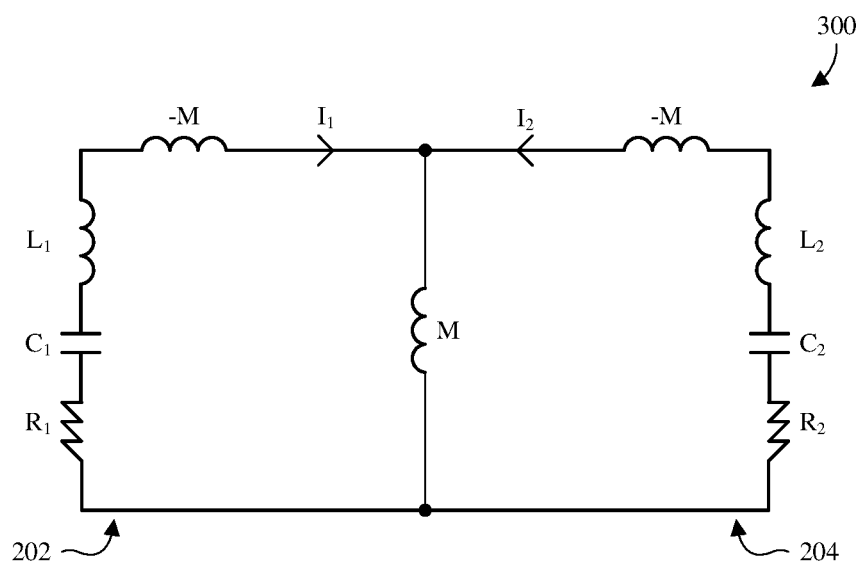
Figure 4:
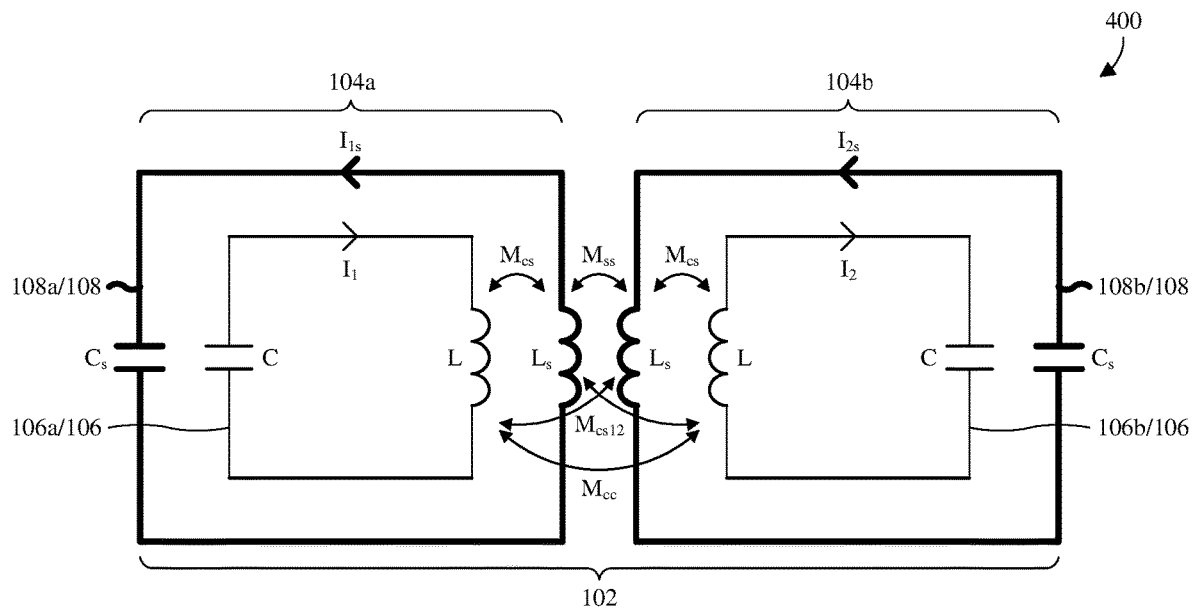

With reference to FIGS. 2-4, various circuit diagrams 200-400 are provided to illustrate the method for isolating the first and second combination coils 104a, 104b of FIGS. 1A and 1B. Focusing specifically on the circuit diagram 200 of FIG. 2, a first resonant coil 202 and a second resonant coil 204 couple to each other through a mutual inductance M.

The first resonant coil 202 comprises a first inductor $L_1$, a first capacitor $C_1$, a first resistor $R_1$, and a first current $I_1$, whereas the second resonant coil 204 comprises a second inductor $L_2$, a second capacitor $C_2$, a second resistor $R_2$, and a second current $I_2$. For simplicity, matching circuits and other supporting circuits are not shown. The first and second inductors $L_1$, $L_2$ may, for example, correspond to conductors of the first and second resonant coils 202, 204. The conductors may, for example, correspond to conductive traces, flexible coaxial cables, or some other suitable conductors. The conductive traces may, for example, be or comprise copper and/or some other suitable material. The first and second capacitors $C_1$, $C_2$ may, for example, correspond to breaking point capacitors and/or some other suitable capacitors. The first and second resistors $R_1$, $R_2$ may, for example, correspond to conductor loss, phantom loss, RF radiation loss, and other suitable coil loss. In embodiments in which the first and second inductors comprise copper, the conductor loss may, for example, correspond to copper loss.

Using Kirchhoff's law on the first and second resonant coils 202, 204 yields Eq. 1, where w is the angular frequency.

$$\begin{cases} I_1\left(j\omega L_1 - j\dfrac{1}{\omega C_1} + R_1\right) + j\omega M I_2 = 0 \\ I_2\left(j\omega L_2 - j\dfrac{1}{\omega C_2} + R_2\right) + j\omega M I_1 = 0 \end{cases} \qquad \text{Eq. 1}$$

By defining $I_0 = I_1 + I_2$, Eq. 1 can be re-written as Eq. 2.

$$\begin{cases} I_1\left(j\omega L_1 - j\omega M - j\dfrac{1}{\omega C_1} + R_1\right) + j\omega M(I_1 + I_2) = 0 \\ I_2\left(j\omega L_2 - j\omega M - j\dfrac{1}{\omega C_2} + R_2\right) + j\omega M(I_1 + I_2) = 0 \end{cases} \qquad \text{Eq. 2}$$

Based on Eq. 2, the circuit diagram 200 of FIG. 2 can be re-drawn as the circuit diagram 300 of FIG. 3. Focusing on the circuit diagram 300 of FIG. 3 provides a more insightful representation of the first and second resonant coils 202, 204. Particularly, the circuit diagram 300 of FIG. 3 shows the mutual inductance M as a shared reactance between the first and second resonant coils 202, 204 and hence shows the mutual inductance causes the coupling between the first and second resonant coils 202, 204. Therefore, it is to be appreciated that the first and second resonant coils 202, 204 are isolated from each other if the mutual inductance M is zero (e.g., M=0). To move the mutual inductance M to zero, the first and second resonant coils 202, 204 may be overlapped. Alternatively, additional transformers may be used.

From Eq. 1, the current ratio between the first and second currents $I_1$, $I_2$ can be derived as shown in Eq. 3.

$$\begin{cases} \dfrac{I_1}{I_2} = \dfrac{-j\omega M}{\left(j\omega L_1 - j\dfrac{1}{\omega C_1} + R_1\right)} \text{ or} \\ \dfrac{I_2}{I_1} = \dfrac{-j\omega M}{\left(j\omega L_2 - j\dfrac{1}{\omega C_2} + R_2\right)} \end{cases} \qquad \text{Eq. 3}$$

If the first and second resonant coils 202, 204 do not have the same resonant frequency, then the first and second capacitors $C_1$, $C_2$ can be used to control the current ratio between the first and second currents $I_1$ and $I_2$. For example, assume the second capacitor $C_2$ is infinite. This means the second resonant coil 204 is a closed conductive loop without a capacitor, whereby Eq. 3 may be simplified as in Eq. 4.

$$\dfrac{I_2}{I_1} = \dfrac{-j\omega M}{(j\omega L_2 + R_2)} \qquad \text{Eq. 4}$$

Based on Eq. 3 and Eq. 4, the current ratio between the first and second resonant coils 202, 204 may be adjusted by independently adjusting the first and second capacitors $C_1$, $C_2$. Further, there are two resonant frequencies of the combination coil defined by the first and second resonant coils 202, 204. If one of the resonant frequencies is the working frequency, then changing the other one of the resonant frequencies (e.g., changing the frequency difference between the two resonant frequencies) changes the current ratio between first and second currents $I_1$ and $I_2$ at the working frequency. This provides the basis for achieving good isolation between the first and second combination coils 104a, 104b of FIGS. 1A and 1B.

An approach to reduce coil loop radiation from a resonant coil is to put a shield near the resonant coil. The shield may, for example, be a solid shield or an open shield. The solid shield may, for example, be a copper sheet or some other suitable conductive sheet. The open shield may, for example, be a continuous conductive loop around or above the resonant coil.

By adding a capacitor to an open shield, the open shield may have a resonant frequency that is tunable (e.g., by tuning the capacitor). Such an open shield may also be known as a resonant shield. Pairing a resonant coil with a resonant shield defines a combination coil. In other words, a combination coil comprises a resonant coil and a resonant shield. Because the resonant coil and the resonant shield border, the resonant coil and the resonant shield are inductively coupled. As a result, the combination coil has a pair of resonant frequencies each partially defined by the resonant coil and the resonant shield. One of the resonant frequencies is mostly defined by the resonant coil, and another one of the resonant frequencies is mostly defined by the resonant shield. The resonant frequencies of the combination coil are to be contrasted with the individual resonant frequencies of the resonant coil and the resonant shield. The individual resonant frequencies of the resonant coil and the resonant shield correspond to resonant frequencies when the resonant coil and the resonant shield are in isolation from each other and other coils. The resonant frequencies of the combination coil correspond to the resonant frequencies when the resonant coil and the resonant shield are inductively coupled together.

By tuning the individual resonant frequencies of the resonant coil and the resonant shield, and hence by tuning the resonant frequencies of the combination coil, a current ratio of the combination coil may be tuned. A current ratio of a combination coil corresponds to a ratio of current in the resonant coil to current in the resonant shield. As explained in detail hereafter, combination coils may be employed as channels in a multi-channel RF coil and individual current ratios of the channels may be adjusted for isolation between the channels.

To better understand use of current ratios for channel isolation, focus is directed towards the circuit diagram 400 of FIG. 4. The circuit diagram 400 illustrates some embodiments the multiple-channel RF coil 102 of FIG. 1 in which the first and second combination coils 104a, 104b are the same. As such, the first and second combination coils 104a, 104b have the same size, shape, and layout. The first and second combination coils 104a, 104b are assumed to be the same for simplicity in describing the isolation method hereafter. However, it is to be appreciated that the isolation method applies to embodiments of the multiple-channel RF coil 102 in which the first and second combination coils 104a, 104b are different.

The resonant coils 106 comprise individual capacitors C and individual inductors L, and the resonant shields 108 comprise individual capacitors $C_s$ and individual inductors $L_s$. The inductors L, $L_s$ correspond to conductors of the resonant coils 106 and the resonant shields 108, whereas the capacitors C, $C_s$ correspond to breaking point capacitors of the resonant coils 106 and/or some other suitable capacitors. Coil loss is assumed to be zero because it does not affect the outcome of the below analysis. The conductors may, for example, correspond to conductive traces, flexible coaxial cables, or some other suitable conductors. The conductive traces may, for example, be or comprise copper and/or some other suitable material.

The resonant coils 106 are inductively coupled by a mutual inductance $N_{cc}$, and the resonant shields 108 are inductively coupled by a mutual inductance $M_{ss}$. Each of the resonant coils 106 is inductively coupled to its own one of the resonant shields 108 by a mutual inductance $M_{cs}$, and each of the resonant coils 106 is inductively coupled to the other resonant coil's one of the resonant shields 108 by a mutual inductance $M_{cs12}$. Parasitic capacitive coupling between the resonant coils 106 and the resonant shields 108 is assumed to be zero because the parasitic capacitive coupling can be minimized with more breaking point capacitors.

Using Kirchhoff's law on the first resonant coil 106a yields Eq. 5, where w is the angular frequency, $I_1$ is current in the first resonant coil 106a, $I_{1S}$ is current in the first resonant shield 108a, $I_2$ is current in the second resonant coil 106b, and $I_{2S}$ is current in the second resonant shield 108b. L, C, $M_{cs}$, $M_{cs12}$, and $M_{cc}$ are as described above.

$$I_1 * \left(j\omega L - j\dfrac{1}{\omega C}\right) + j\omega M_{CS} I_{1S} + j\omega M_{CS12} I_{2S} + j\omega M_{CC} I_2 = 0 \qquad \text{Eq. 5}$$

As seen in Eq. 5, the first combination coil 104a is isolated from the second combination coil 104b when a sum of the last two terms is zero. This is shown below by Eq. 6.

$$j\omega M_{cs12} I_{2s} + j\omega M_{cc} I_2 = 0 \qquad \text{Eq. 6}$$

By rewriting Eq. 6 into Eq. 7, it can be seen that the first combination coil 104a can be isolated from the second combination coil 104b by appropriately selecting a current ratio of the second combination coil 104b.

$$\frac{I_{2s}}{I_2} = -\frac{M_{CC}}{M_{CS12}} \qquad \text{Eq. 7}$$

Because the second combination coil 104b is also isolated from the first combination coil 104a, performing Kirchhoff's law on the second combination coil 104b yields Eq. 8.

$$\begin{cases} I_2 * \left(j\omega L - j\frac{1}{\omega C}\right) + j\omega M_{CS} I_{2s} = 0 \\ I_{2s} * \left(j\omega L_S - j\frac{1}{\omega C_S}\right) + j\omega M_{CS} I_2 = 0 \end{cases} \qquad \text{Eq. 8}$$

Eq. 8 can then be rewritten as Eq. 9.

$$\frac{I_{2s}}{I_2} = -\frac{\left(\omega L - \frac{1}{\omega C}\right)}{\omega M_{CS}} = -\frac{\omega M_{CS}}{\left(\omega L_S - \frac{1}{\omega C_S}\right)} \qquad \text{Eq. 9}$$

Combining Eq. 7 and Eq. 9 yields Eq. 10.

$$\frac{I_{2s}}{I_2} = -\frac{M_{CC}}{M_{CS12}} = -\frac{\left(\omega L - \frac{1}{\omega C}\right)}{\omega M_{CS}} = -\frac{\omega M_{CS}}{\left(\omega L_S - \frac{1}{\omega C_S}\right)} \qquad \text{Eq. 10}$$

Eq. 10 is the solution to achieve isolation between the first and second combination coils 104a, 104b. Practically, L, $L_s$, $M_{cc}$, $M_{cs}$, and $M_{cs12}$ are geometrically defined and therefore cannot be readily changed without changing geometry or conductor dimensions. However, C or/and $C_s$ can be readily changed to achieve isolation according to Eq. 10. Further, as described above, the first and second combination coils 104a, 104b each have multiple resonant frequencies different than individual resonant frequencies of the resonant coils 106 and the resonant shields 108. C or/and $C_s$ can be changed to achieve isolation according to Eq. 10 while keeping a resonant frequency of each combination coil at a common working frequency. For example, for MRI, the common working frequency may be a suitable Larmor frequency.

In another word, the isolation method according to the present disclosure uses the coupling between each resonant coil 106 and its corresponding resonant shield 108 to cancel the coupling between the first and second combination coils 104a, 104b. Particularly, because of this coupling, the first and second combination coils 104a, 104b each have two resonant frequencies. Adjusting the frequency difference between the two resonant frequencies changes the current ratio of a combination coil. At the right current ratio, coupling cancelation in the other combination channel is achieved. Hence, the frequency difference for each of the first and second combination coils 104a, 104b is adjusted for canceling in the other combination coil.

Performing isolation as described above allows isolation from a low magnetic field to a high magnetic field. Such a low magnetic field may, for example, be a magnetic field at or less than about 0.5 Tesla or some other suitable value. Such a high magnetic field may, for example, be a magnetic field at or greater than about 7 Tesla, 11.7 Tesla, or some other suitable value. Also, performing isolation as described above provides a global isolation improvement. The mutual inductance (e.g., $M_{cc}$ and $M_{cs12}$ in Eq. 10) between the first and second combination coils 104a, 104b changes slowly with changes in relative positioning of the first and second combination coils 104a, 104b. If the isolation at one position is good, the isolation at other neighboring positions is likely to be good. Hence, isolation according to the present disclosure has improved isolation compared to overlap-based isolation, capacitor-based isolation, and preamplifier-based isolation. This may yield a higher signal-to-noise (SNR) for phased array receive coils and less coupling for parallel transmit coils.

Figure 5:
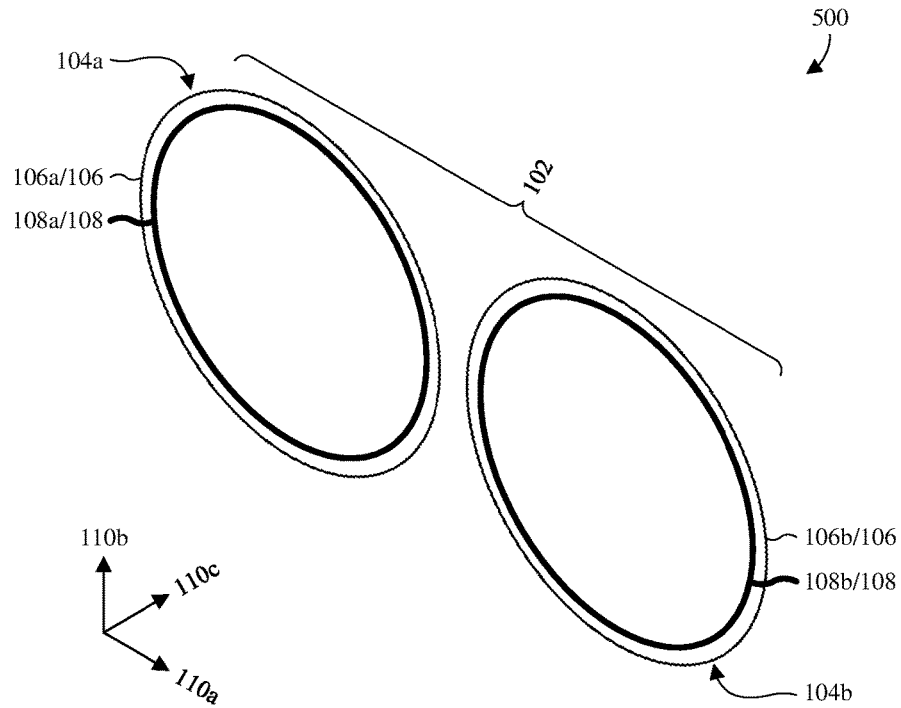
FIGS. 5-8 provide perspective views of some alternative embodiments of the multiple-channel RF coil of FIGS. 1A and 1B in which resonant coils are varied in size and/or plane relative to resonant shields.

With reference to FIG. 5, a perspective view 500 of some alternative embodiments of the multiple-channel RF coil 102 of FIGS. 1A and 1B is provided in which the resonant shields 108 are smaller than the resonant coils 106. As such, the resonant coils 106 respectively surround the resonant shields 108. Further, the resonant coils 106 and the resonant shields 108 share a common plane, which extends in the first dimension 110a and the second dimension 110b. In alternative embodiments, the resonant coils 106 may be in different planes and/or the resonant shields 108 may be in different planes. Further, in alternative embodiments, the resonant coils 106 may be in different planes than the resonant shields 108.

Figure 6:
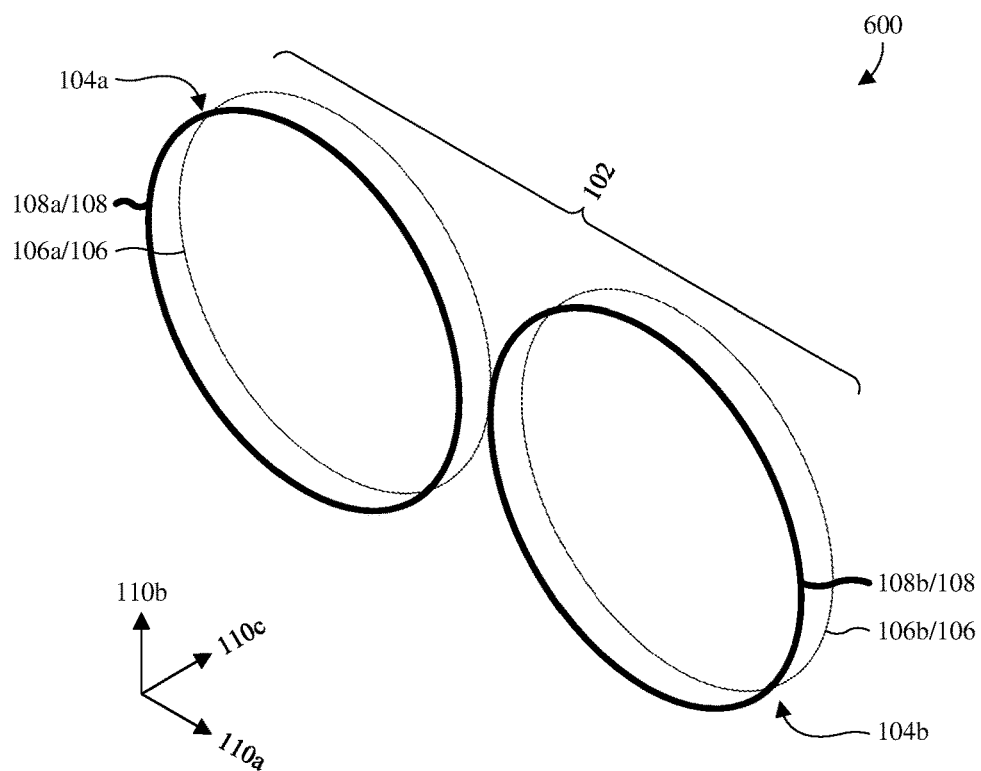

With reference to FIG. 6, a perspective view 600 of some alternative embodiments of the multiple-channel RF coil 102 of FIGS. 1A and 1B is provided in which the resonant coils 106 are the same size respectively as the resonant shields 108. Further, the resonant coils 106 are in a different plane than the resonant shields 108. For example, the resonant coils 106 are in a first plane, whereas the resonant shields 108 are in a second plane. The first and second planes extend in the first and second dimensions 110a, 110b and are laterally offset in the third dimension 110c orthogonal to the first and second dimensions 110a, 110b.

Figure 7:
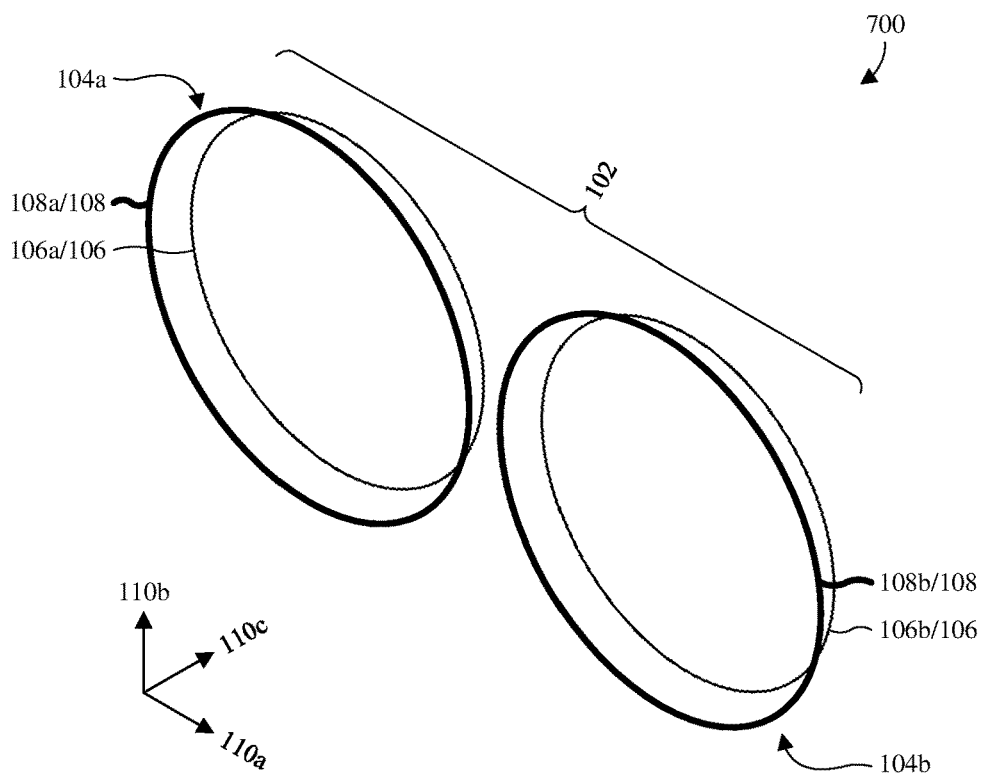
Figure 8:
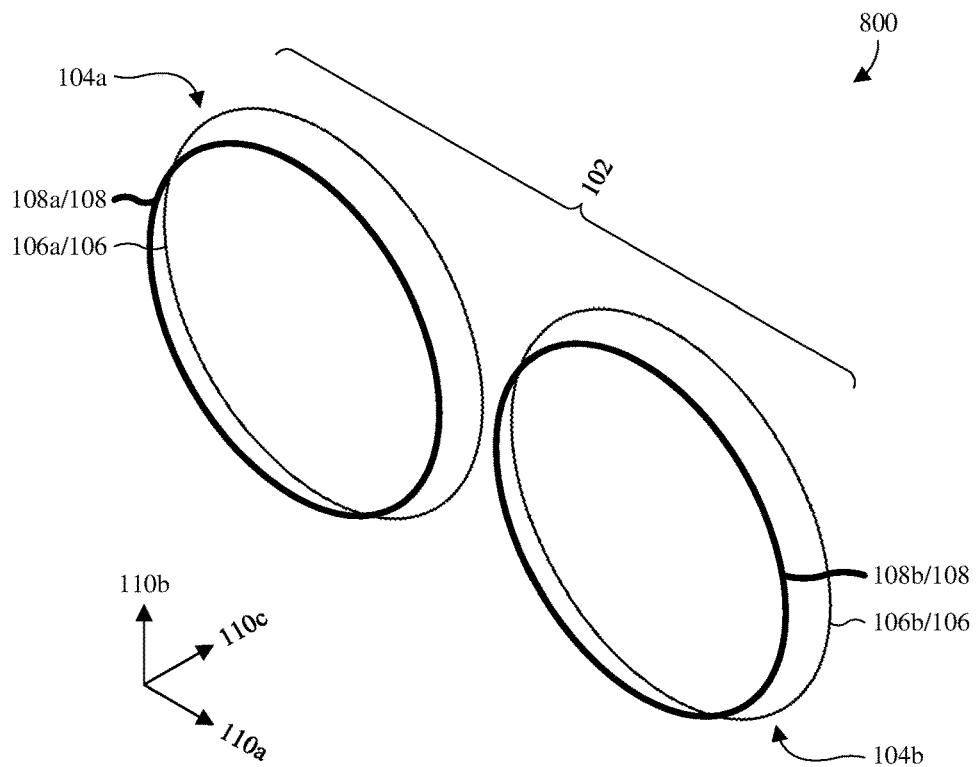

With reference FIGS. 7 and 8, perspective views 700, 800 of some alternative embodiments of the multiple-channel RF coil 102 of FIG. 6 are provided in which the resonant shields 108 have different sizes than the resonant coils 106. Particularly, in FIG. 7, the resonant shields 108 are larger than the resonant coils 106. Further, in FIG. 8, the resonant shields 108 are smaller than the resonant coils 106.

Figure 9:
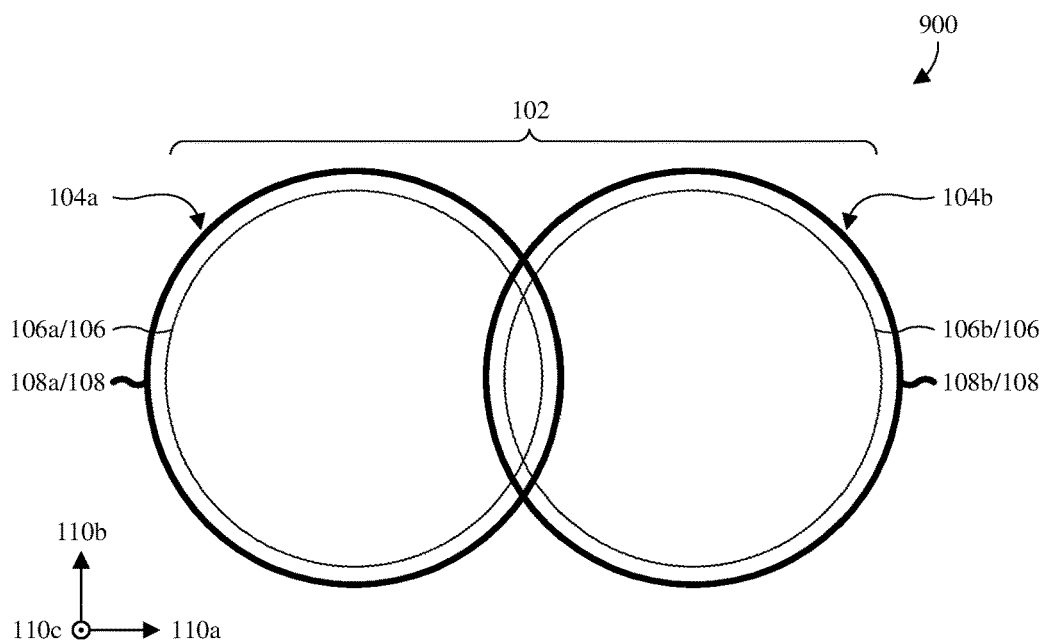
FIG. 9 provides a perspective view of some alternative embodiments of the multiple-channel RF coil of FIGS. 1A and 1B in which combination coils overlap.

With reference to FIG. 9, a side view 900 of some alternative embodiments of the multiple-channel RF coil 102 of FIGS. 1A and 1B is provided in which the first and second combination coils 104a, 104b overlap. Note that even though the first and second combination coils 104a, 104b appear to directly contact, the first and second combination coils 104a, 104b may be spaced out of view (e.g., in the third dimension 110c).

Overlapping the first and second combination coils 104a, 104b reduces inductive coupling between the first and second combination coils 104a, 104b and may be used in combination with the isolation method of the present disclosure for enhanced isolation. As above, the isolation method of the present disclosure employs the resonant shields 108 to negate or reduce inductive coupling between the first and second combination coils 104a, 104b.

Thus far, the resonant coils 106 and the resonant shields 108 have been loop shaped. In alternative embodiments, the resonant coils 106 and/or the resonant shields 108 may have other suitable shapes. For example, the resonant coils 106 and/or the resonant shields 108 may be saddle shaped, birdcage shaped, or shaped according to some other suitable shape.

Figure 10A:
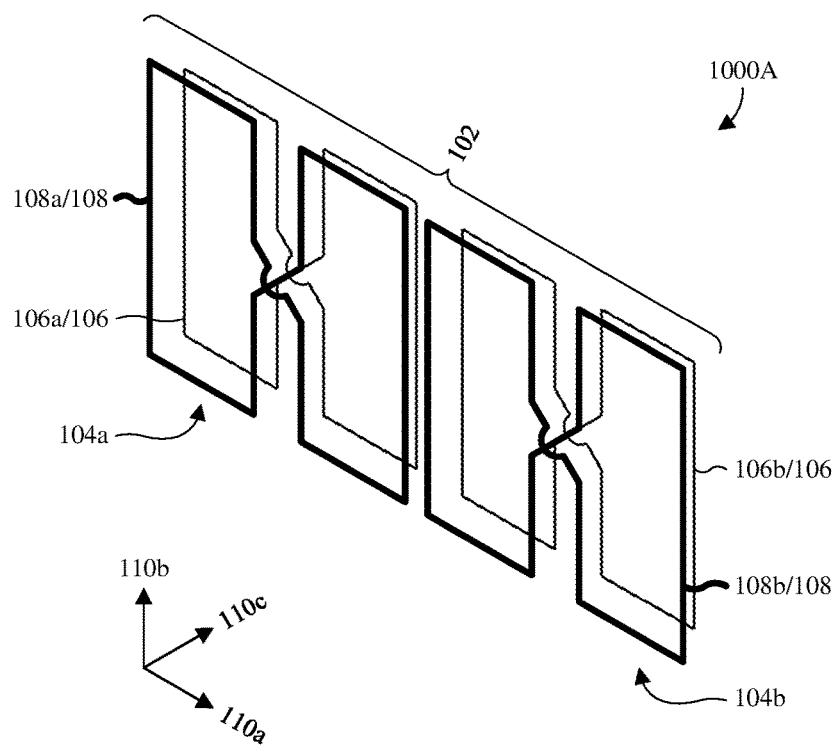
FIGS. 10A, 10B, 11A, and 11B provide various views of some alternative embodiments of the multiple-channel RF coil of FIGS. 1A and 1B in which resonant coils and resonant shields have different shapes.
Figure 10B:
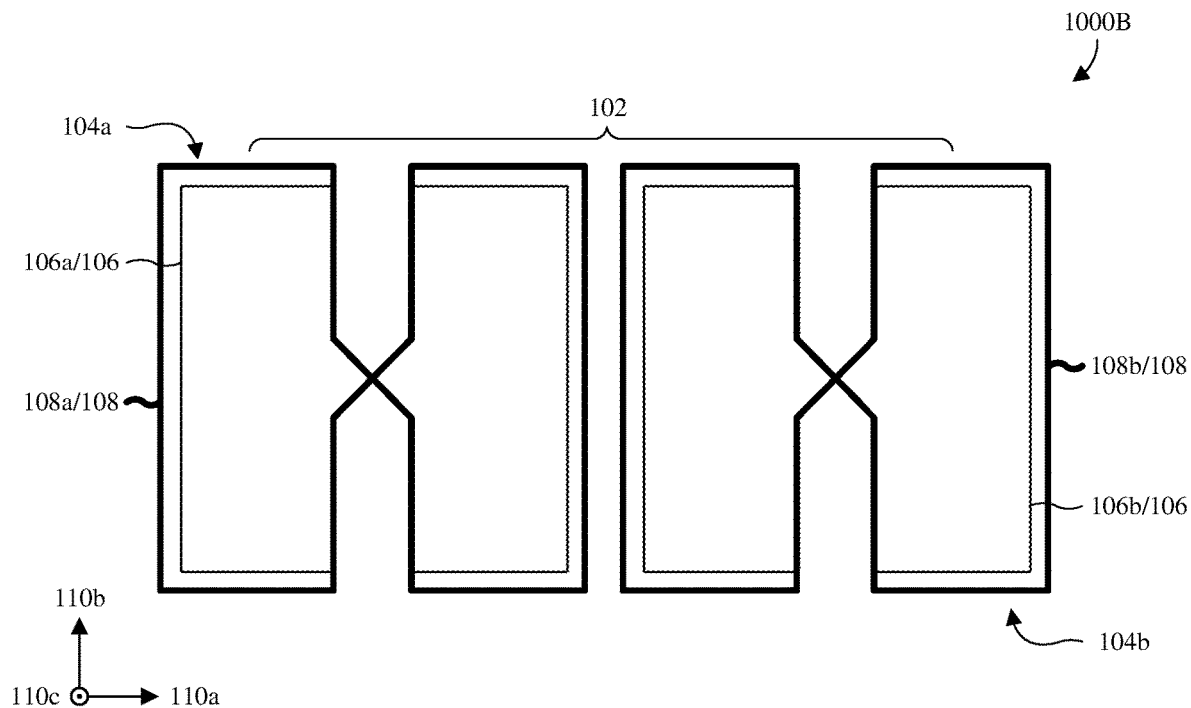

With reference to FIGS. 10A and 10B, various views 1000A, 1000B of some alternative embodiments of the multiple-channel RF coil 102 of FIGS. 1A and 1B is provided in which the resonant coils 106 and the resonant shields 108 are saddle shaped. FIG. 10A illustrates a perspective view 1000A, whereas FIG. 10B illustrates a side view 1000B.

The resonant shields 108 are larger than the resonant coils 106 and are in a different plane. For example, the resonant shields 108 are in a first plane, whereas the resonant coils 106 are in a second plane parallel to the first plane. The first and second planes may, for example, extend in the first dimension 110a and the second dimension 110b and may, for example, be offset from each other in the third dimension 110c. In alternative embodiments, the resonant shields 108 are smaller than, or the same size as, the resonant coils 106. Further, in alternative embodiments, the resonant coils 106 and the resonant shields 108 are in the same plane.

Figure 11A:
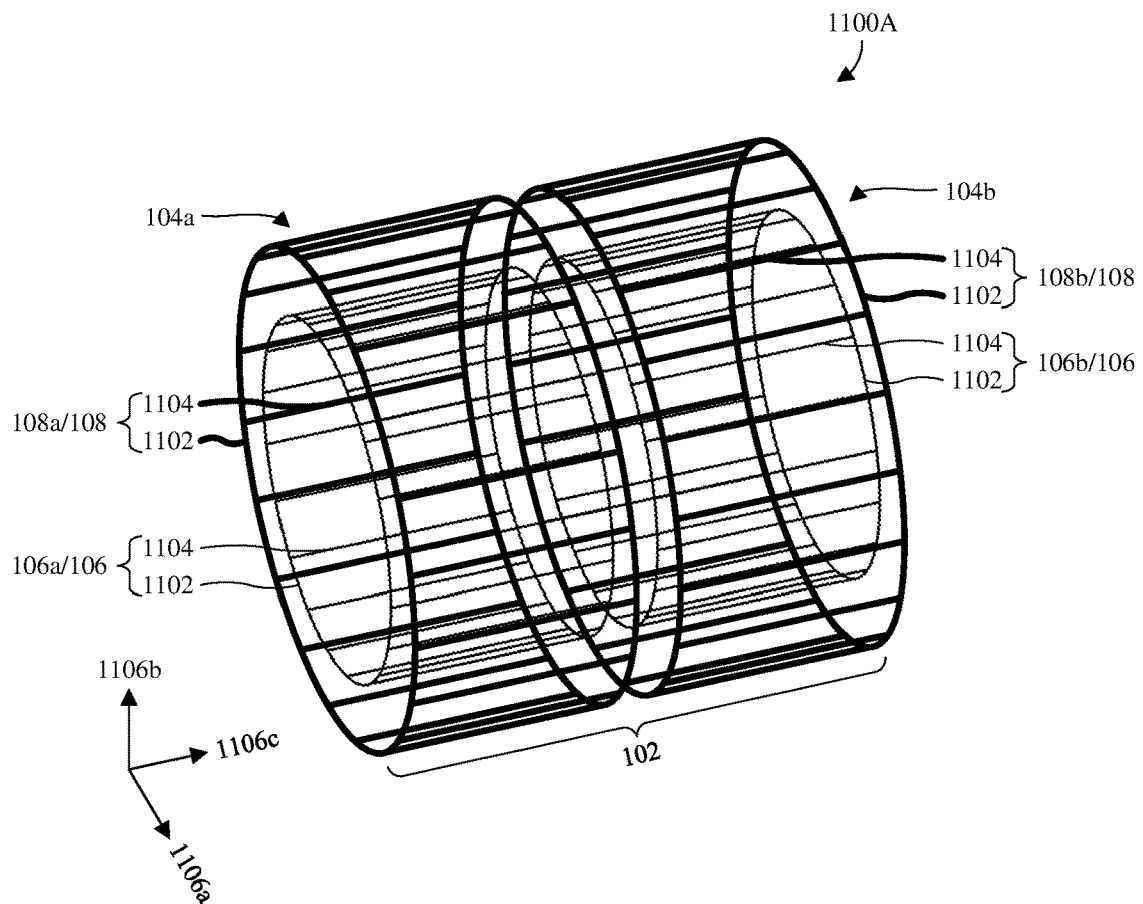
Figure 11B:
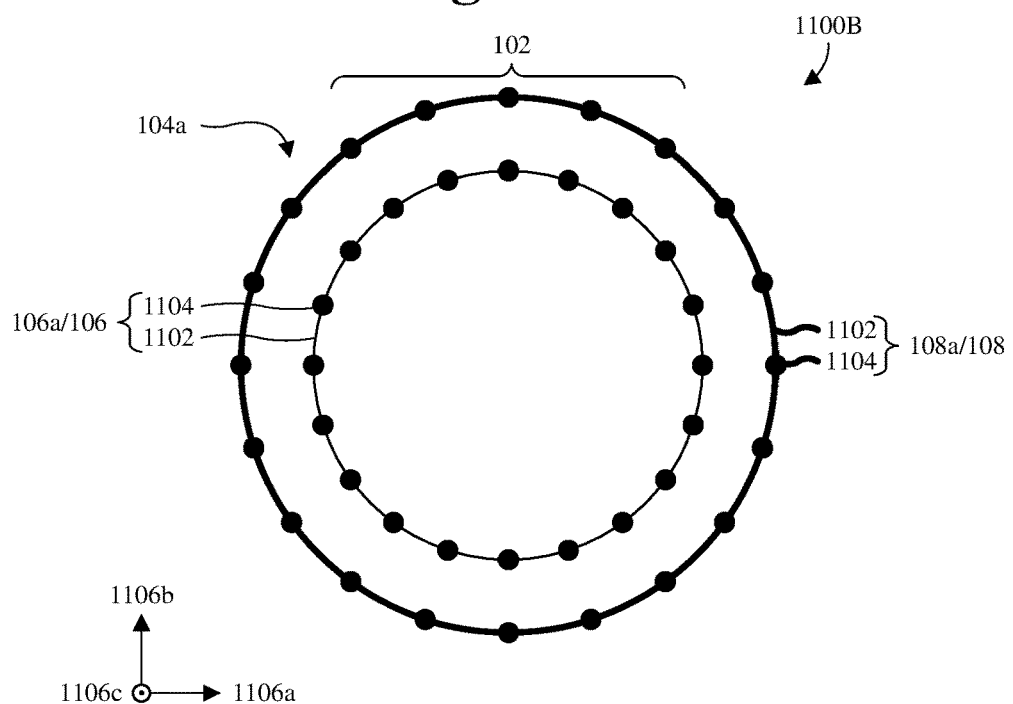

With reference to FIGS. 11A and 11B, various views 1100A, 1100B of some alternative embodiments of the multiple-channel RF coil 102 of FIGS. 1A and 1B is provided in which the resonant coils 106 and the resonant shields 108 are birdcage shaped. FIG. 11A illustrates a perspective view 1100A, whereas FIG. 11B illustrates a side view 1100B.

The resonant coils 106 and the resonant shields 108 comprise individual pairs of rings 1102 and individual pluralities of rungs 1104 (schematically represented by black dots in FIG. 11B). The rings 1102 of the resonant coils and shields 106, 108 extend in a first dimension 1106a and a second dimension 1106b orthogonal to the first dimension 1106a. Further, the rings 1102 surround a common axis extending in a third dimension 1106c and are laterally offset from each other along the common axis. For each of the resonant coils 106, the rungs 1104 of the resonant coil are circumferentially spaced around the common axis and extend along the common axis to interconnect the rings 1102 of the resonant coil. Similarly, for each of the resonant shields 108, the rungs 1104 of the resonant shield are circumferentially spaced around the common axis and extend along the common axis to interconnect the rings 1102 of the resonant shield.

In some embodiments, the rings 1102 of the resonant coils and shields 106, 108 have a same axis. In alternative embodiments, the rings 1102 of the resonant coils and shields 106, 108 have different axes. Further, in alternative embodiments, the rings 1102 of the first resonant coils and shields 106a, 108a share a first axis, whereas the rings 1102 of the second resonant coils and shields 106b, 108b share a second axis offset from the first axis.

In some embodiments, the resonant coils and shields 106, 108 each have twenty rungs 1104. In alternative embodiments, the resonant coils and shields 106, 108 have different numbers of rungs 1104. Further, in alternative embodiments, the first resonant coils and shields 106a, 108a each have a first number of rungs 1104, whereas the second resonant coils and shields 106b, 108b each have a second number of rungs 1104 different than the first number.

With exception of the multiple-channel RF coil 102 of FIGS. 11A and 11B, the multiple-channel RF coil 102 has been flat. However, in alternative embodiments, the multiple-channel RF coil 102 may have other suitable shapes. For example, the multiple-channel RF coil 102 may have a cylindrical shape, a half enclosed curved shape (e.g., a U shape, a half cylindrical shape, etc.), or some other suitable.

Figure 12A:
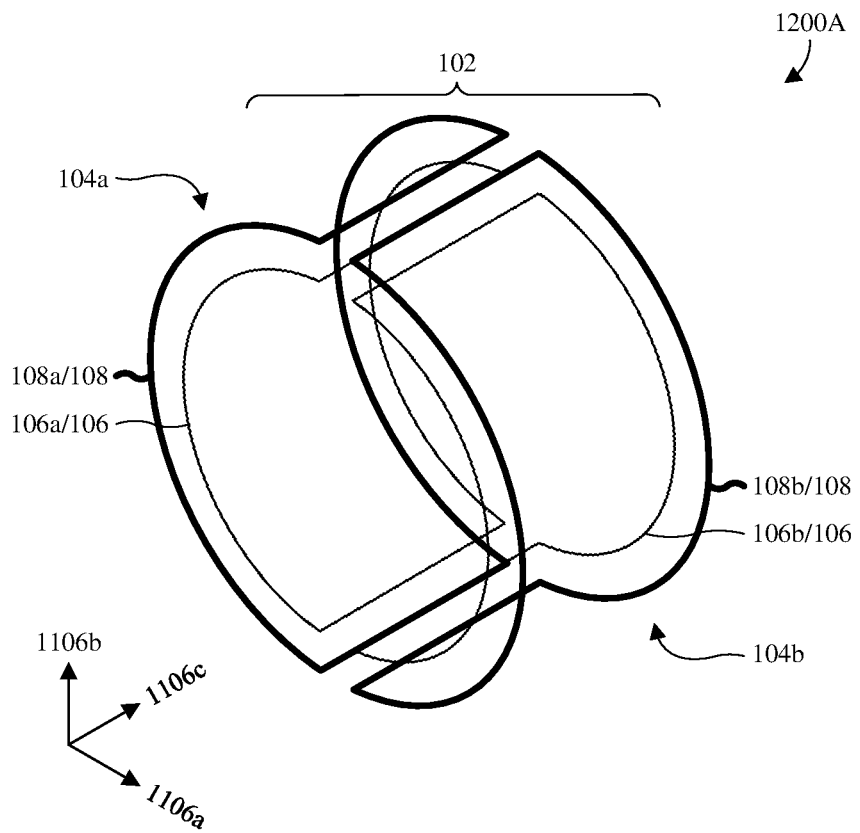
FIGS. 12A, 12B, 13A, and 13B provide various views of some alternative embodiments of the multiple-channel RF coil of FIGS. 1A and 1B in which the multiple-channel RF coil has different shapes.
Figure 12B:
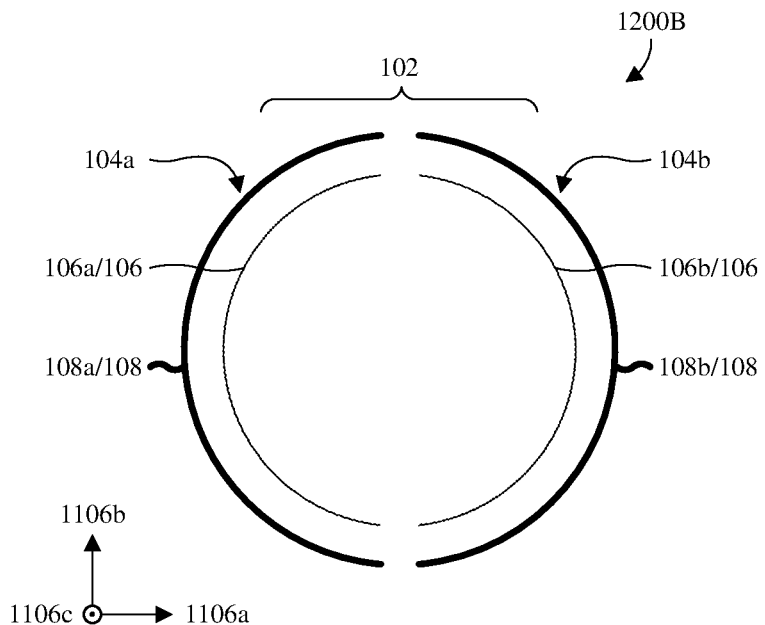

With reference to FIGS. 12A and 12B, various views 1200A, 1200B of some alternative embodiments of the multiple-channel RF coil 102 of FIGS. 1A and 1B is provided in which the multiple-channel RF coil 102 has a cylindrical shape. FIG. 12A illustrates a perspective view 1200A, whereas FIG. 12B illustrates a side view 1200B. The resonant coils 106 are arranged circumferentially around a common axis at a first radius, and the resonant shields 108 are arranged circumferentially around the common axis at a second radius greater than the first radius. The central axis extends along the third dimension 1106c. In alternative embodiments, the first and second radii are the same or the second radius is less than the first radius.

Figure 13A:
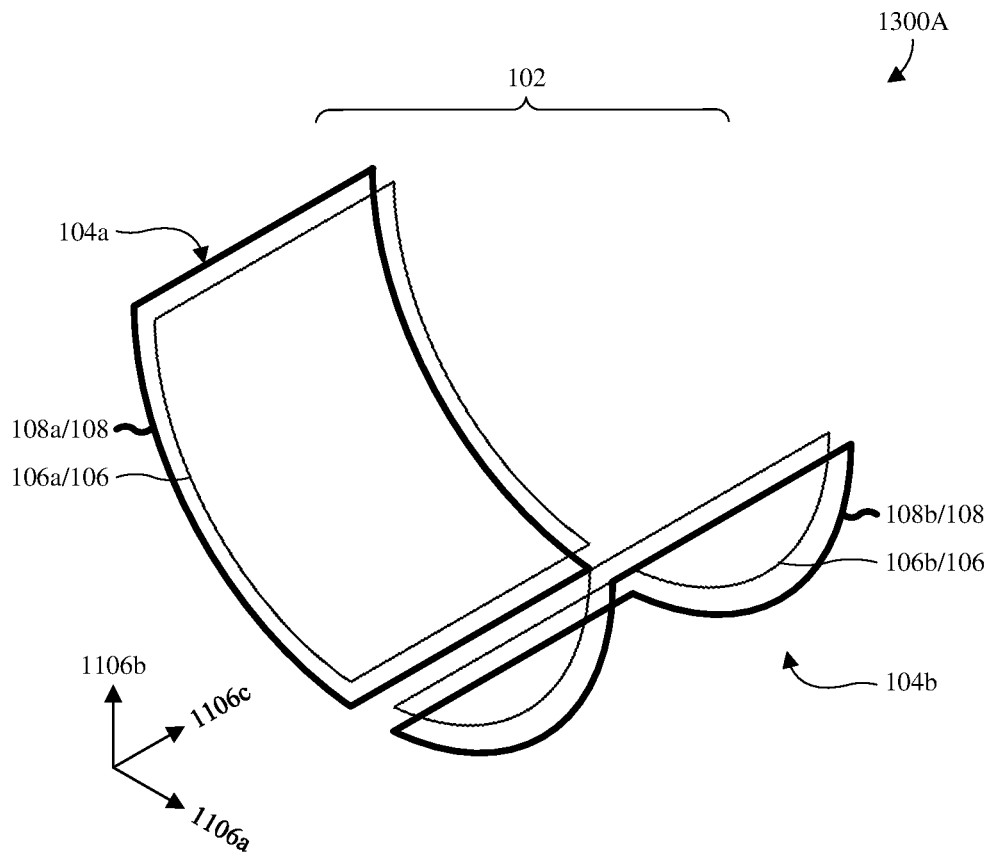
Figure 13B:
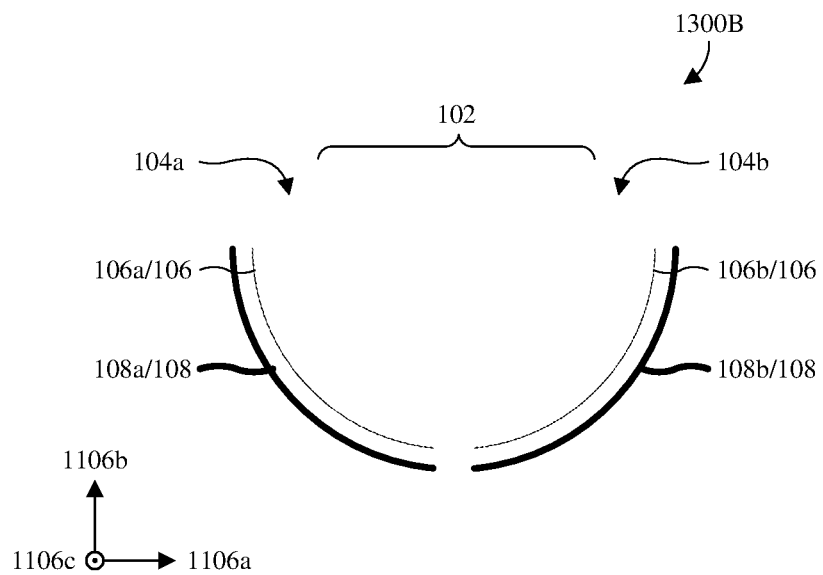

With reference to FIGS. 13A and 13B, various views 1300A, 1300B of some alternative embodiments of the multiple-channel RF coil 102 of FIGS. 1A and 1B is provided in which the multiple-channel RF coil 102 has a half-enclosed curved shape. FIG. 13A illustrates a perspective view 1300A, whereas FIG. 13B illustrates a side view 1300B. The half-enclosed curve shape may, for example, be U-shaped, V-shaped, or some other suitable shape.

The resonant coils 106 conform to the half-enclosed curved shape with a first radial distance from an axis extending in the third dimension 1106c, whereas the resonant shields 108 conform to the half-enclosed curved shape with a second radial distance from the axis. Further, the second radial distance is greater than the first radial distance, such that the resonant coils 106 are between the axis and the resonant shields 108. In alternative embodiments, the first and second radial distances are the same or the first radial distance is greater than the second radial distance.

Thus far, the multiple-channel RF coil 102 has been had two combination coils. In alternative embodiments, the multiple-channel RF coil 102 may have more combination coils. For example, the multiple-channel RF coil 102 may have three, four, or more combination coils. When the multi-channel RF coil 102 has more than two combination coils, the isolation method of the present disclosure does is unable to provide perfect isolation between the combination coils. However, the isolation method can improve isolation by finding the resonant frequency differences, and hence current ratios, that maximize isolation.

Figure 14:
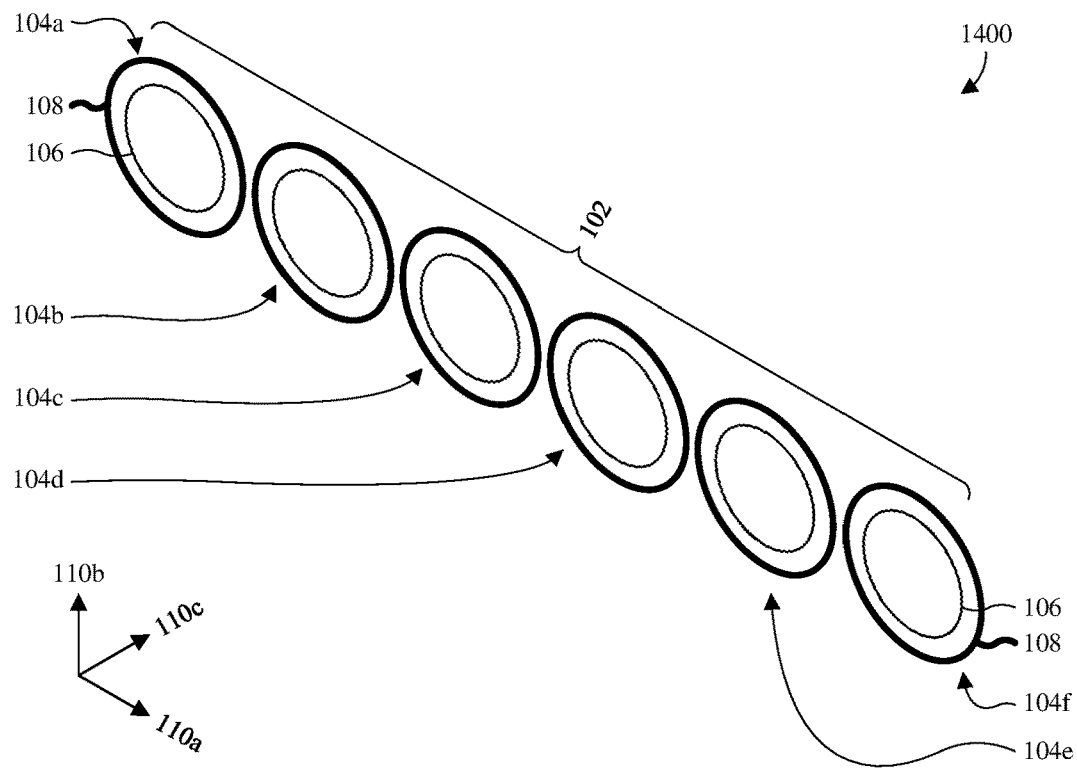
FIG. 14 provides a perspective view of some alternative embodiments of the multiple-channel RF coil of FIGS. 1A and 1B in which the multiple-channel RF coil has additional combination coils.

With reference to FIG. 14, a perspective view 1400 of the multiple-channel RF coil 102 is provided in which the multiple-channel RF coil 102 further has additional combination coils. Particularly, the multiple-channel RF coil 102 further has a third combination coil 104c, a fourth combination coil 104d, a fifth combination coil 104e, and a sixth combination coil 104f. The additional combination coils (e.g., 104c-104f) are each as the first and second combination coils 104a, 104b are described, and the resonant frequency differences of the combination coils (e.g., 104a-104f) are tuned to maximize isolation according to the method of the present disclosure.

Figure 15:
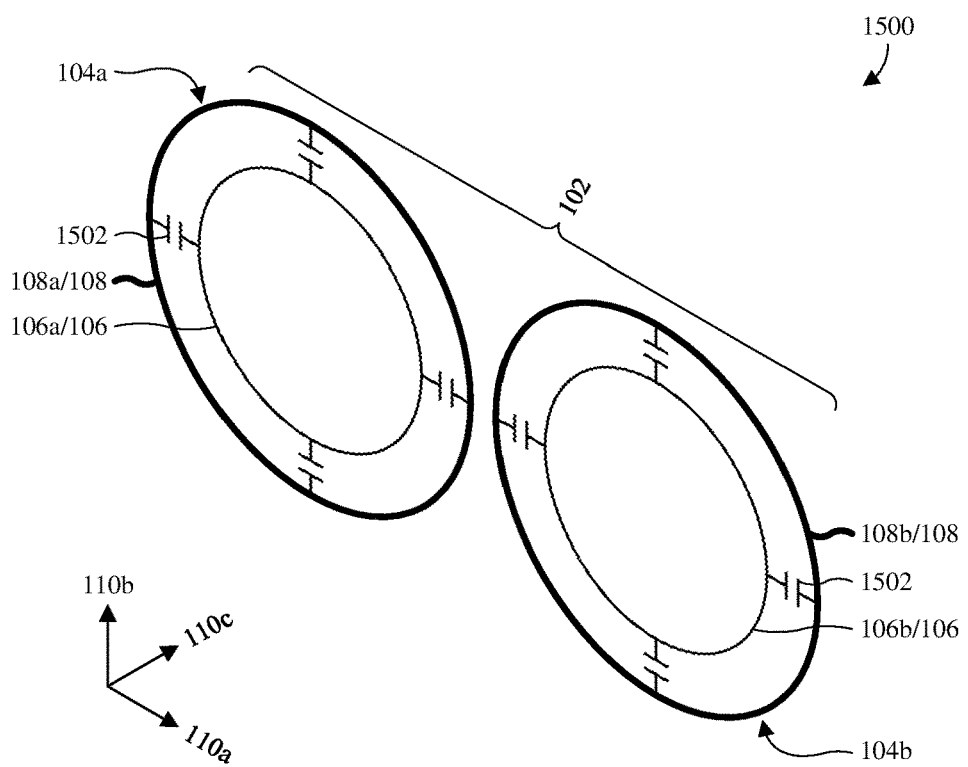
FIG. 15 provides a perspective view of some more detailed embodiments of the multiple-channel RF coil of FIGS. 1A and 1B in which resonant coils are coupled respectively to resonant shields by coupling capacitors.

With reference to FIG. 15, a perspective view 1500 of some alternative embodiments of the multiple-channel RF coil 102 of FIGS. 1A and 1B is provided in which the resonant coils 106 are coupled respectively to the resonant shields 108 by coupling capacitors 1502. This is to be contrasted with the inductive coupling of FIGS. 1A and 1B.

By using the coupling capacitors 1502 for coupling, the isolation method of the present disclosure has an additional degree of freedom for achieving isolation between the first and second combination coils 104a, 104b. Particularly, the coupling capacitors 1502 may be further tuned to promote isolation between the first and second combination coils 104a, 104b. However, the underlying isolation method is the same.

The first and second combination coils 104a, 104b each couple individually to a resonant coil of the other combination coil and to a resonant shield of the other combination coil. Further, the other combination coil is tuned so the two couplings have the same magnitude and opposite phases, thereby resulting in cancellation. The magnitude and the phases are controlled by the frequency difference of the other combination coil, and the frequency difference is controlled by the coupling capacitors 1502 of the other combination coil and individual capacitors (not shown) defining the resonant coil of the other combination coil and the resonant shield of the other combination coil. The individual capacitors may, for example, be breaking point capacitors and/or some other suitable capacitors. See, for example, capacitors 1606 described hereafter.

Notwithstanding that the first and second combination coils 104a, 104b are illustrated as each having four coupling capacitors 1502, more or less coupling capacitors 1502 are amenable. For example, the first and second combination coils 104a, 104b may alternatively each have two, three, five, or some other suitable number of coupling capacitors.

While FIG. 15 describes a variation to the multiple-channel RF coil 102 of FIGS. 1A and 1B in which the resonant coils 106 are coupled to the corresponding resonant shields 108 by coupling capacitors 1502, the variation is applicable to any of FIGS. 5-9, 10A and 10B to 13A and 13B, and 14. In other words, the resonant coils 106 in FIGS. 5-9, 10A and 10B to 13A and 13B, and 14 may alternatively be coupled to the corresponding resonant shields 108 in FIGS. 5-9, 10A and 10B to 13A and 13B, and 14 by coupling capacitors 1502 as described with regard to FIG. 15.

Figure 16:
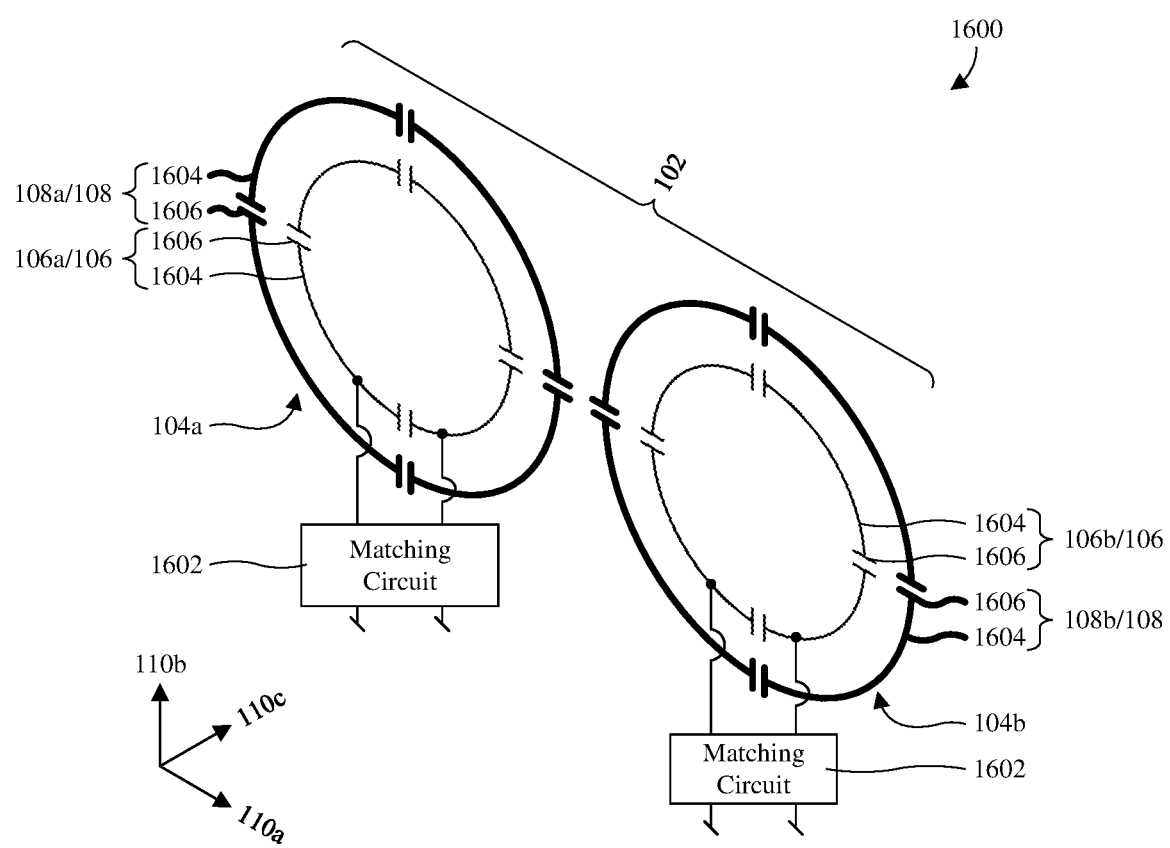
FIG. 16 provides a perspective view of some more detailed embodiments of the multiple-channel RF coil of FIGS. 1A and 1B in which the multiple-channel RF coil is shown in more detail.

With reference to FIG. 16, a perspective view 1600 of some more detailed embodiments of the multiple-channel RF coil 102 of FIGS. 1A and 1B is provided in which constituents of the resonant coils and shields 106, 108 are shown. Further, the first and second combination coils 104a, 104b comprise individual matching circuits 1602.

Regarding the constituents of the resonant coils and shields 106, 108, the resonant coils 106 and the resonant shields 108 comprise individual conductors 1604 and individual capacitors 1606 arranged in a loop. The conductors 1604 may, for example, correspond to conductive traces, flexible coaxial cables, or some other suitable conductors. The conductive traces may, for example, be or comprise copper and/or some other suitable material. The capacitors 1606 correspond to breaking point capacitors and/or some other suitable capacitors. In some embodiments, the conductors 1604 respectively define the inductors $L$, $L_s$, and/or the capacitors 1606 respectively define the capacitors $C$, $C_s$, within the circuit diagram 400 of FIG. 4.

Regarding the matching circuits 1602, the matching circuits 1602 couple the first and second combination coils 104a, 104b to individual preamplifiers (not shown) and/or individual transmitters (not shown). For example, when the multiple-channel RF coil 102 is employed as a receive coil, the matching circuits 1602 may couple the first and second combination coils 104a, 104b to individual preamplifiers. As another example, when the multiple-channel RF coil 102 is employed as a transmit coil, the matching circuits 1602 may couple the first and second combination coils 104a, 104b to individual transmitters. Further, the matching circuits 1602 perform impedance matching between the first and second combination coils 104a, 104b and the individual preamplifiers and/or transmitters.

In some embodiments, the first and second combination coils 104a, 104b each correspond to a single RF channel and hence each have a single matching circuit 1602. Hence, each resonant coil 106 and its corresponding resonant shield 108 share a single matching circuit and do not have individual matching circuits. For example, each resonant coil 106 is directly coupled to a single matching circuit and its resonant shield 108 is inductively (e.g., wirelessly) coupled to the single matching circuit through the resonant coil 106.

While FIG. 16 describes more detailed embodiments of the multiple-channel RF coil 102 of FIGS. 1A and 1B in which the multiple-channel RF coil 102 has matching circuits 1602, conductors 1604, and capacitors 1606, it is to be appreciated that the multiple-channel RF coil 102 in any of FIGS. 5-9, 10A and 10B to 13A and 13B, 14, and 15 may also have matching circuits 1602, conductors 1604, and capacitors 1606 as described with regard to FIG. 16. These features were omitted for ease and clarity of illustration. As an example, the resonant coils and shields 106, 108 of FIGS. 12A and 12B may comprise individual conductors 1604 and individual capacitors 1606 as described with regard to FIG. 16. As another example, the resonant coils and shields 106, 108 of FIGS. 11A and 11B may have individual conductors 1604 and individual capacitors 1606 as described with regard to FIG. 16. The individual capacitors 1606 may be only on the rings 1102 of FIGS. 11A and 11B, only on the rungs 1104 of FIGS. 11A and 11B, or on both the rings 1102 and the rungs 1104 of FIGS. 11A and 11B.

Figure 17:
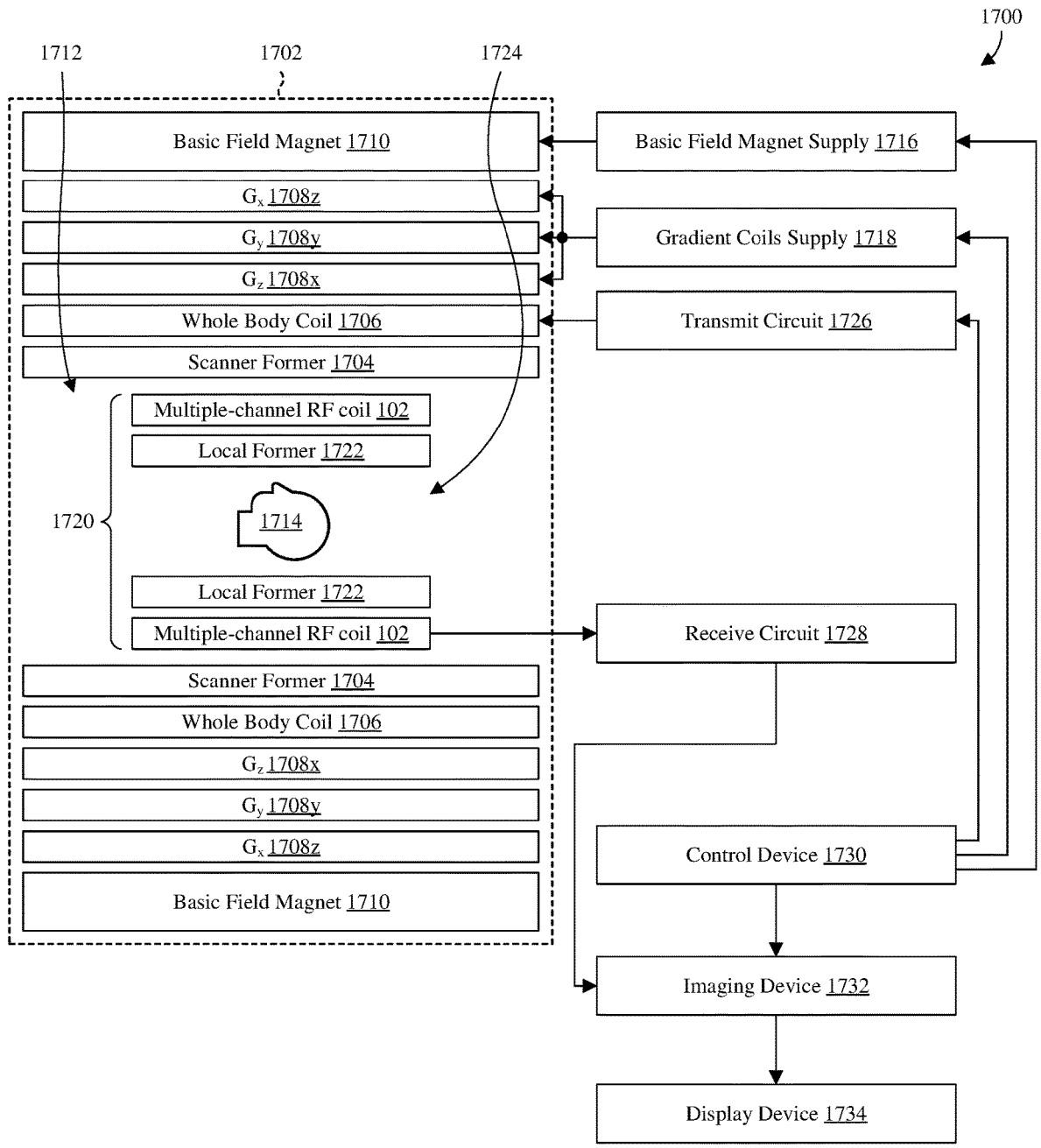
FIG. 17 provides a block diagram of some embodiments of an MRI system comprising a multiple-channel RF coil with enhanced inter-channel isolation according to aspects of the present disclosure.

With reference to FIG. 17, a block diagram 1700 of some embodiments of an MRI system is provided in which a multiple-channel RF coil 102 is employed as a local receive coil. The multiple-channel RF coil 102 may, for example, be as in any of FIGS. 1A and 1B, 5-9, 10A and 10B to 13A and 13B, and 14-16. The MRI system comprises a scanner 1702, and the scanner 1702 comprises a scanner former 1704, a whole body coil (WBC) 1706, a plurality of gradient coils 1708x-1708z, and a basic field magnet 1710.

The scanner former 1704 surrounds a scanner bore 1712, which is sized to receive a scan target 1714 for MRI (e.g., a patient). Further, the scanner former 1704 is surrounded by the WBC 1706, the gradient coils 1708x-1708z, and the basic field magnet 1710. The scanner former 1704 provides rigidity to the surrounding structure (e.g., the WBC 1706) and may, for example, be or be part of a housing of the scanner 1702. Further, the scanner former 1704 may, for example, have a shape that is cylindrical or the like.

The WBC 1706 surrounds the scanner former 1704, the gradient coils 1708x-1708z surround the WBC 1706, and the basic field magnet 1710 surrounds the gradient coils 1708x-1708z. The basic field magnet 1710 is electrically coupled to, and controlled in part by, a basic field magnet power supply 1716. The basic field magnet 1710 produces a $B_0$ magnetic field over the scan target 1714 in a Z direction. The Z direction may, for example, be left to right in FIG. 17. Further, the Z direction may, for example, correspond to the first or second dimension 110a, 110b in any of FIGS. 1A, 1B, 5-9, 10A, 10B, 14, and 15 and may, for example, correspond to the third dimension 1106c in any of FIGS. 11A and 11B to 13A and 13B.

The gradient coils 1708x-1708z emit gradient magnetic fields to spatially encode MRI signals received from the scan target 1714. The gradient coils 1708x-1708z include an x-direction gradient coil 1708*x*, a y-direction gradient coil 1708*y*, and a z-direction gradient coil 1708*z* for spatially encoding the MRI signals respectively in the X, Y, and Z directions. The Z direction is parallel to the $B_0$ magnetic field produced by the basic field magnet 1710, whereas the X and Y directions are transverse to the $B_0$ magnetic field. In alternative embodiments, one or more of the gradient coils 1708*x*-1708*z* is/are omitted. The gradient coils 1708*x*-1708*z* are electrically coupled to, and controlled in part, by a gradient coil power supply 1718.

A local MRI coil 1720 is in the scanner bore 1712 and comprises a local former 1722 and the multiple-channel RF coil 102. The local former 1722 surrounds a local bore 1724, which is sized to receive an anatomical feature of the scan target 1714 for MRI. The anatomical feature may, for example, be a head, a knee, a wrist, a leg, a body, an arm, or some other suitable type of anatomical feature. Further, the local former 1722 is surrounded by the multiple-channel RF coil 102. The local former 1722 provides rigidity to the surrounding structure (e.g., the multiple-channel RF coil 102) and may, for example, be or be part of a housing of the local MRI coil 1720. Further, the local former 1722 may, for example, have a shape that is cylindrical or the like. As described above, the multiple-channel RF coil 102 may, for example, be as in any of FIGS. 1A and 1B, 5-9, 10A and 10B to 13A and 13B, and 14-16.

A transmit circuit 1726 is electrically coupled to the WBC 1706. The transmit circuit 1726 may, for example, be electrically coupled to the WBC 1706 by phase shifters, matching circuits, combiners, and so on. The transmit circuit 1726 drives the WBC 1706 to generate a $B_1$ magnetic field transverse to the $B_0$ magnetic field when the MRI system operates in transmit mode. For example, the transmit circuit 1726 may drive the WBC 1706 to generate RF pulses at the Larmor frequency for hydrogen nuclei or some other suitable nuclei. The $B_1$ magnetic field excites nuclei in the scan target 1714, which causes the nuclei to emit MRI signals. When the MRI system operates in a receive mode, the WBC 1706 is disabled.

A receive circuit 1728 is electrically coupled to the multiple-channel RF coil 102. The multiple-channel RF coil 102 may, for example, be a phased array receive coil or some other suitable type of coil. The receive circuit 1728 comprises a plurality of preamplifiers, and each channel of the multiple-channel RF coil 102 is electrically coupled to an individual preamplifier of the plurality. In other words, each combination coil of the multiple-channel RF coil 102 (see, e.g., 104*a* and 104*b* in any of FIGS. 1A, 1B, 5-9, 10A and 10B to 13A and 13B, and 14-16) is electrically coupled to an individual preamplifier of the plurality.

In the receive mode of the MRI system, the receive circuit 1728 receives the MRI signals using the multiple-channel RF coil 102. As described above, these MRI signals are generated in response to excitation of nuclei by the WBC 1706 when the MRI system is in the transmit mode. In the transmit mode of the MRI system, the multiple-channel RF coil 102 is decoupled from the $B_1$ magnetic field to prevent damage to the receive circuit 1728.

The basic field magnet power supply 1716, the gradient coil power supply 1718, the transmit circuit 1726, or any combination of the foregoing is/are controlled by a control device 1730. An imaging device 1732 receives MRI signals from the receive circuit 1728 and, in some embodiments, receives control signals from the control device 1730. Based thereon, the imaging device 1732 generates an image of the scan target 1714 and outputs the image to a display device 1734. The imaging device 1732 generates the image by performing a transformation process on the MRI signals, such as, for example, a two-dimensional fast Fourier transform (FFT) or some other suitable transform. The control device 1730 may, for example, be a general-purpose device executing instructions or an application-specific device. Similarly, the imaging device 1732 may, for example, be a general-purpose device executing instructions or an application-specific device. A general-purpose device may, for example, be a general-purpose computer or some other suitable device. An application-specific device may, for example, be an application-specific integrated circuit (ASIC) or some other suitable device. While the control device 1730 and the imaging device 1732 are shown as being separate, the control device 1730 and the imaging device 1732 may be integrated together in alternative embodiments.

Figure 18A:
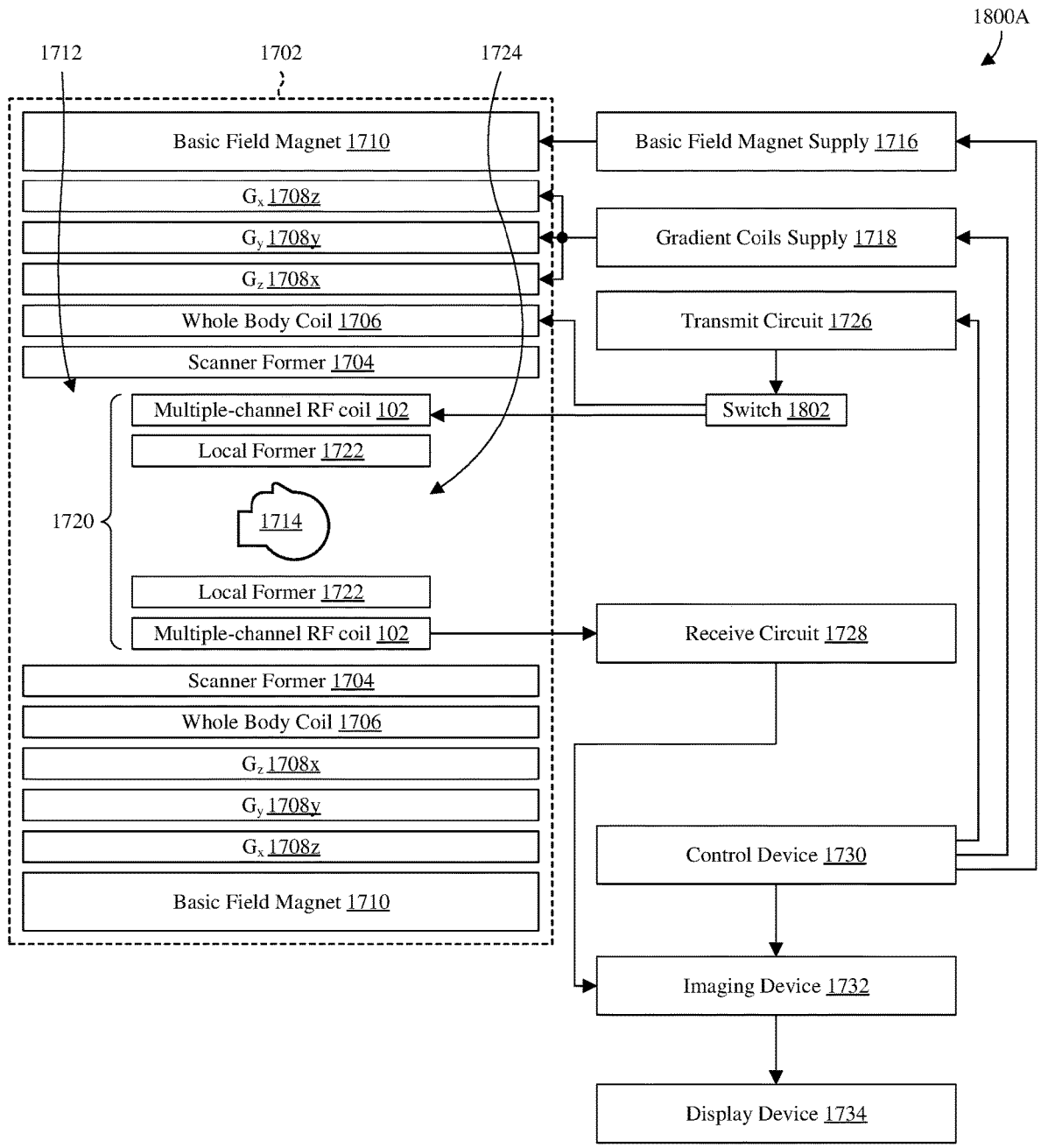
FIGS. 18A-18C provide block diagrams of some alternative embodiments of the MRI system of FIG. 17.
Figure 18B:
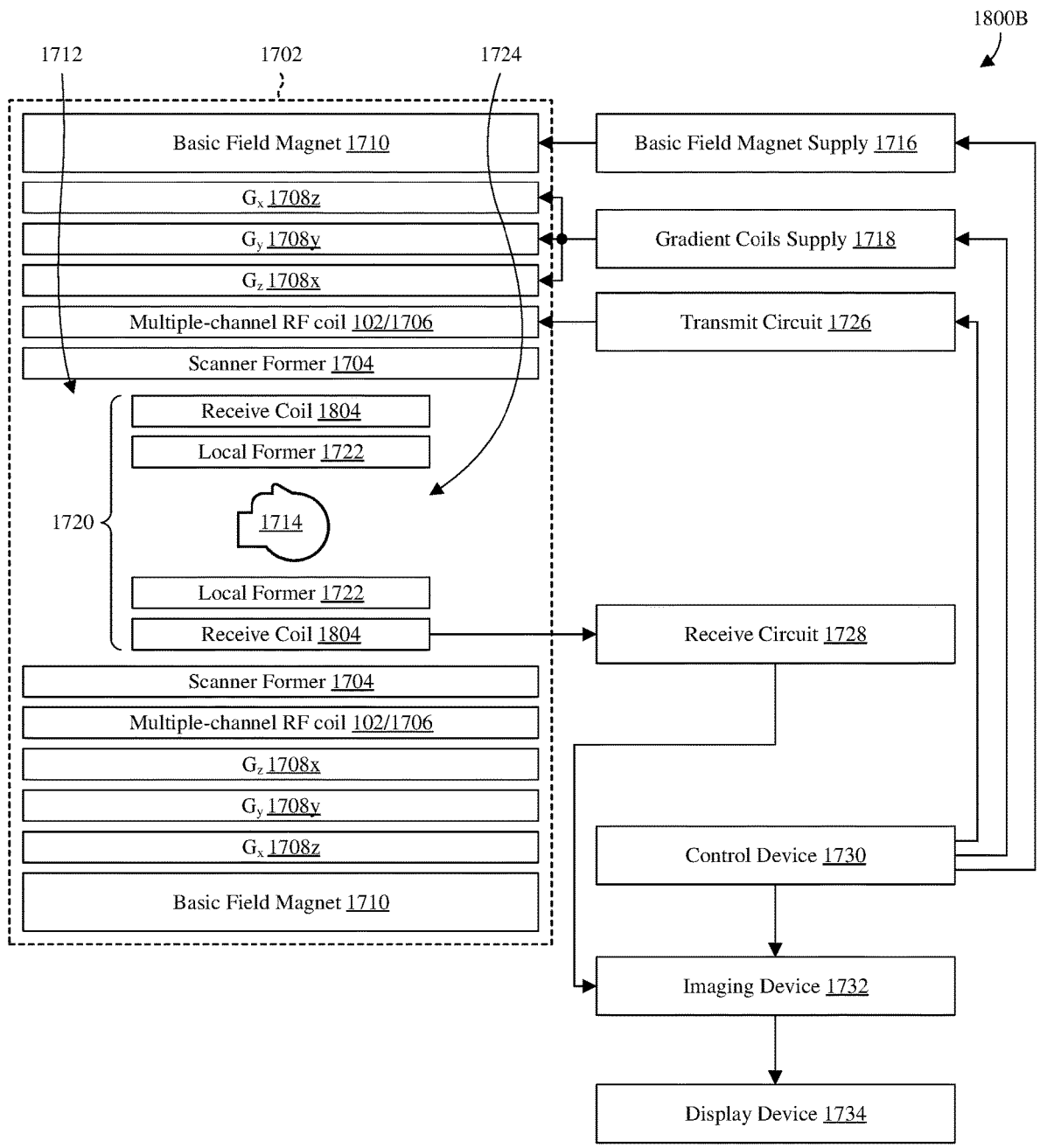
Figure 18C:
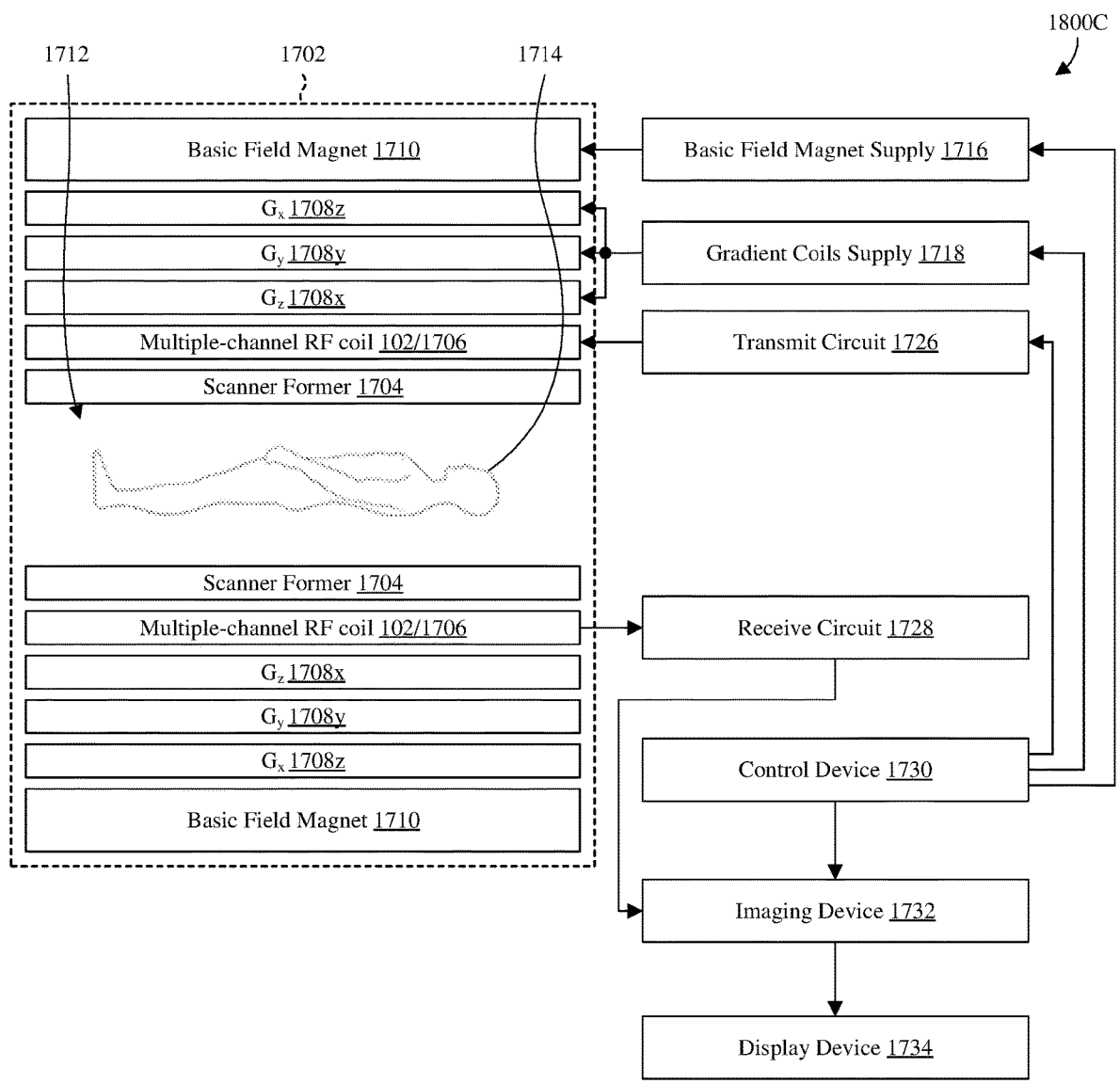

With reference to FIGS. 18A-18C, block diagrams 1800A-1800C of some alternative embodiments of the MRI system of FIG. 17 is provided.

In FIG. 18A, the transmit circuit 1726 is electrically coupled to both the WBC 1706 and the multiple-channel RF coil 102 through a switch 1802. The switch 1802 provides selective coupling of the transmit circuit 1726 to the WBC 1706 and the multiple-channel RF coil 102, such that either the WBC 1706 or the multiple-channel RF coil 102 may be used for transmitting RF energy. Hence, the multiple-channel RF coil 102 may be used in both a transmit mode and a receive mode. In alternative embodiments, the WBC 1706 is omitted. Further, in alternative embodiments, the receive circuit 1728 is electrically coupled to the WBC 1706 instead of the multiple-channel RF coil 102, such that the WBC 1706 is employed to receive MRI signals instead of the multiple-channel RF coil 102.

The transmit circuit 1726 comprises a plurality of transmitters, and each channel of the multiple-channel RF coil 102 is associated with an individual transmitter of the plurality. In other words, each combination coil of the multiple-channel RF coil 102 (see, e.g., 104*a* and 104*b* in any of FIGS. 1A, 1B, 5-9, 10A and 10B to 13A and 13B, and 14-16) is associated with individual transmitter of the plurality. When the transmit circuit 1726 is electrically coupled to the multiple-channel RF coil 102 through the switch 1802, each channel of the multiple-channel RF coil 102 is electrically coupled to the corresponding transmitter.

In FIG. 18B, the multiple-channel RF coil 102 is employed as the WBC 1706 and is hence external to the local MRI coil 1720. Further, the local MRI coil 1720 has a receive coil 1804 in place of the multiple-channel RF coil 102. In such embodiments, the multiple-channel RF coil 102 may be employed to transmit RF energy into the scan target 1714, and the receive coil 1804 may be employed to receive MRI signals, during MRI.

In FIG. 18C, the local MRI coil 1720 is omitted. Further, the multiple-channel RF coil 102 is employed as the WBC 1706. In such embodiments, the multiple-channel RF coil 102 is used in both a receive mode and a transmit mode during MRI.

Figure 19:
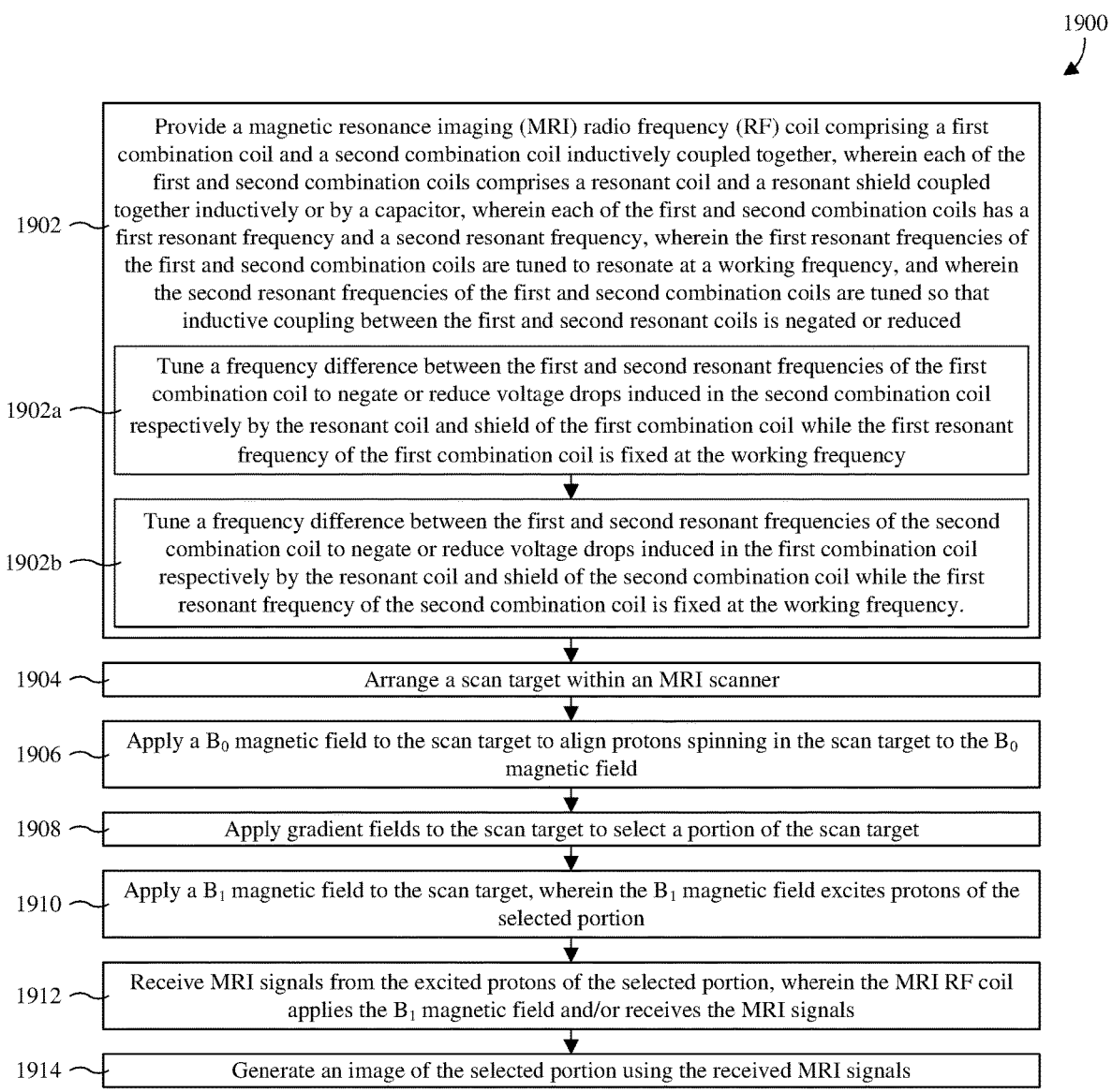
FIG. 19 provides a flow chart of some embodiments of a method for performing MRI using a multiple-channel RF coil with enhanced inter-channel isolation according to aspects of the present disclosure.

With reference to FIG. 19, a flow chart 1900 of some embodiments of method for performing MRI using a multiple-channel RF coil with enhanced inter-channel isolation according to aspects of the present disclosure is provided. The multiple-channel RF coil 102 may, for example, be as in any of FIGS. 1A, 1B, 5-9, 10A and 10B to 13A and 13B, and 14-16. Further, the method may, for example, be performed using the MRI system as in any of FIGS. 17 and 18A-18C or using some other suitable MRI system.

At 1902, a MRI RF coil comprising a first combination coil and a second combination coil inductively coupled together is provided. Each of the first and second combination coils comprises a resonant coil and a resonant shield coupled together inductively or by a capacitor. Further, each of the first and second combination coils has a first resonant frequency and a second resonant frequency. The first resonant frequencies of the first and second combination coil are tuned to resonate at a working frequency, and the second resonant frequencies of the first and second combination coils are tuned so that inductive coupling between the first and second resonant coils is negated. Such tuning is performed as described with regard to FIGS. 1A-1B and 2-4.

At 1902a, the providing of the MRI RF coil comprises tuning a frequency difference between the first and second resonant frequencies of the first combination coil to negate or reduce voltage drops induced in the second combination coil respectively by the resonant coil and shield of the first combination coil while the first resonant frequency of the first combination coil is fixed at the working frequency. As described above, this has the effect of changing a current ratio of the first combination coil, such that a voltage induced in the second combination coil by the resonant coil of the first combination coil has a same or substantially the same magnitude and an opposite phase as a voltage induced in the second combination coil by the resonant shield of first combination coil. Practically, such tuning is achieved by varying capacitors of the first combination coil (see, e.g., 1606 of FIG. 16 and, where present, 1502 of FIG. 15). The tuning may, for example, be achieved by trial and error or by solving Eq. 10 for C and $C_s$ after measuring or otherwise determining values for remaining parameters in Eq. 10.

At 1902b, the providing of the MRI RF coil comprises tuning a frequency difference between the first and second resonant frequencies of the second combination coil to negate or reduce voltage drops induced in the first combination coil respectively by the resonant coil and shield of the second combination coil while the first resonant frequency of the second combination coil is fixed at the working frequency. As described above, this has the effect of changing a current ratio of the second combination coil, such that a voltage induced in the first combination coil by the resonant coil of the second combination coil has a same or substantially the same magnitude and an opposite phase as a voltage induced in the first combination coil by the resonant shield of second combination coil. Practically, such tuning is achieved by varying capacitors of the second combination coil (see, e.g., 1606 of FIG. 16 and, where present, 1502 of FIG. 15). The tuning may, for example, be achieved by trial and error or by solving Eq. 10 for C and $C_s$ after measuring or otherwise determining values for remaining parameters in Eq. 10.

At 1904, a scan target is arranged within an MRI scanner.

At 1906, a $B_0$ magnetic field is applied to the scan target to align protons spinning in the scan target to the $B_0$ magnetic field.

At 1908, gradient fields are applied to the scan target to select a portion of the scan target.

At 1910, a $B_1$ magnetic field is applied to the scan target. Further, the $B_1$ magnetic field excites protons of the selected portion.

At 1912, MRI signals are received from the excited protons of the selected portion. The MRI RF coil applies the $B_1$ magnetic field at 1910 and/or receives the MRI signals at 1912.

At 1914, an image of the selected portion is generated using the received MRI signals.

While the flow chart 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a MRI RF coil, including: a first combination coil including a first resonant coil and a first resonant shield, wherein the first resonant coil and the first resonant shield are coupled to each other by mutual inductance or by a first capacitor, and wherein the first combination coil has a first resonant working frequency and a first resonant isolation frequency; and a second combination coil including a second resonant coil and a second resonant shield, wherein the second resonant coil and the second resonant shield are coupled to each other by mutual inductance or by a second capacitor, and wherein the second combination coil has a second resonant working frequency and a second resonant isolation frequency; wherein the first and second resonant coils are inductively coupled to each other and respectively to the second and first resonant shields, wherein the first and second resonant working frequencies are the same, and wherein the first and second resonant isolation frequencies are such that inductive coupling between the first and second resonant coils is negated. In some embodiments, the first resonant coil and the first resonant shield are physically spaced from each other and are coupled by mutual inductance. In some embodiments, the first resonant coil is coupled to the first resonant shield by the first capacitor. In some embodiments, the first resonant isolation frequency is such that a voltage induced in the second resonant coil by first resonant coil is negated by a voltage induced in the second resonant coil by the first resonant shield. In some embodiments, the MRI RF coil is flat. In some embodiments, the MRI RF coil is U shaped. In some embodiments, the MRI RF coil is cylindrical, wherein the first and second combination coils are circumferentially arranged around an axis of the MRI RF coil. In some embodiments, the first and second combination coils are nonoverlapping. In some embodiments, the first and second combination coils are overlapping. In some embodiments, the MRI RF coil further includes: a third combination coil including a third resonant coil and a third resonant shield, wherein the third resonant coil and the third resonant shield are coupled to each other by mutual inductance or by a third capacitor, and wherein the third combination coil has a third resonant working frequency and a third resonant isolation frequency; wherein the second and third resonant coils are inductively coupled to each other and respectively to the third and second resonant shields, wherein the second and third resonant working frequencies are the same, and wherein the second and third resonant isolation frequencies are such that inductive coupling between the first and second resonant coils is negated.

In some embodiments, the present disclosure provides a MRI including an MRI radio frequency (RF) coil, wherein the MRI RF coil includes: a first combination coil including a first resonant coil and a first resonant shield, wherein the first resonant coil and the first resonant shield are coupled by mutual inductance or by a first coupling capacitor, wherein the first resonant coil has a first coil capacitor, and wherein the first resonant shield has a first shield capacitor; and a second combination coil including a second resonant coil and a second resonant shield, wherein the second resonant coil and the second resonant shield are electrically coupled inductively or by a second coupling capacitor, wherein the second resonant coil has a second coil capacitor, and wherein the second resonant shield has a second shield capacitor; wherein the first and second combinations coils share a common resonant frequency, wherein the first coil and shield capacitors are tuned so voltages induced in the second resonant coil respectively by the first resonant coil and the first resonant shield negate each other, and wherein the second coil and shield capacitors are tuned so voltages induced in the first resonant coil respectively by the second resonant coil and the second resonant shield negate each other. In some embodiments, the first resonant coil and the first resonant shield are coupled by the first coupling capacitor, wherein the first coupling capacitor is further tuned so voltages induced in the second resonant coil respectively by the first resonant coil and the first resonant shield negate each other. In some embodiments, the first resonant coil and the first resonant shield are loop shaped and extend laterally around individual axes, wherein the individual axes border and are substantially parallel to each other. In some embodiments, the first resonant coil and the first resonant shield are saddle shaped. In some embodiments, the first resonant coil and the first resonant shield are birdcage shaped. In some embodiments, the first combination coil has a first combination resonant frequency and a second combination resonant frequency, wherein the first and second combination resonant frequencies are defined collectively by the first resonant coil and the first resonant shield, and wherein the first and second combination resonant frequencies are different than individual resonant frequencies respectively of the first resonant coil and the first resonant shield. In some embodiments, the MRI system further includes an MRI scanner including a basic field magnet, wherein the MRI scanner is configured to generate a $B_0$ magnetic field; wherein the MRI RF coil is configured to apply a $B_1$ magnetic field to a target, and wherein the $B_1$ magnetic field is transverse to the $B_0$ magnetic field. In some embodiments, the MRI system further includes: an MRI scanner including a basic field magnet, wherein the MRI scanner is configured to generate a $B_0$ magnetic field; and a transmit coil configured to apply a $B_1$ magnetic field to a target, wherein the $B_1$ magnetic field is transverse to the $B_0$ magnetic field; wherein the MRI RF coil is configured to receive MRI signals from the target in response to excitation by the $B_1$ magnetic field.

In some embodiments, the present disclosure provides a method for MRI including: providing a MRI RF coil including a first combination coil and a second combination coil inductively coupled together, wherein each of the first and second combination coils includes a resonant coil and a resonant shield coupled together inductively or by a capacitor, wherein each of the first and second combination coils has a first resonant frequency and a second resonant frequency, wherein the first resonant frequencies of the first and second combination coils are tuned to resonate at a working frequency, and wherein the second resonant frequencies of the first and second combination coils are tuned so that inductive coupling between the first and second resonant coils is negated; and performing an MRI process on a target using the MRI RF coil as a transmit coil and/or a receive coil, wherein the MRI process excites the target with RF energy at the working frequency and generates an image of the target. In some embodiments, the providing includes tuning the second resonant frequency of the first combination coil such that a voltage induced in the resonant coil of the second combination coil by the resonant coil of the first combination coil is negated by a voltage induced in the resonant coil of the second combination coil by the resonant shield of the first combination coil, wherein the first resonant frequency of the first combination coil is fixed at the working frequency during the tuning. In some embodiments, the resonant coil of the first combination coil is coupled to the resonant shield of the first combination coil by the capacitor of the first combination coil, wherein the tuning includes varying the capacitor of the first combination coil to change the second resonant frequency of the first combination coil. In some embodiments, the resonant coil of the second combination coil and the resonant shield of the second combination coil respectively have a first current and a second current during a transmit or receive mode of the MRI process, wherein the resonant coil of the first combination coil is inductively coupled to the resonant coil of the second combination coil a first mutual inductance, wherein the resonant coil of the first combination coil is inductively coupled to the resonant shield of the second combination coil by a second mutual inductance, and wherein the providing includes: tuning a first ratio of the second current to the first current so the first ratio is equal to a negative of a second ratio of the first mutual inductance to the second mutual inductance.

The following includes definitions of selected terms employed herein. The definitions include various examples or forms of components that fall within the scope of a term and that may be used for implementation. The examples are not intended to be limiting. Both singular and plural forms of terms may be within the definitions.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments belong. It will be further understood that terms (e.g., those defined in commonly used dictionaries) should be interpreted as having a meaning that is consistent with their meaning in the context of the relevant art and will not be interpreted in an idealized or overly formal sense unless expressly so defined herein.

In the above description, some components may be displayed in multiple figures carrying the same reference signs but may not be described multiple times in detail. A detailed description of a component may then apply to that component for all its occurrences.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on refer to actions and processes of a computer system, logic, processor, or similar electronic device that manipulates and transforms data represented as physical and/or electronic quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

What is claimed is:

1. A magnetic resonance imaging (MRI) radio frequency (RF) coil, comprising:
   a first combination coil comprising a first resonant coil and a first resonant shield, wherein the first resonant coil and the first resonant shield are coupled to each other by mutual inductance or by a first capacitor, and wherein the first combination coil has a first resonant working frequency and a first resonant isolation frequency; and
   a second combination coil comprising a second resonant coil and a second resonant shield, wherein the second resonant coil and the second resonant shield are coupled to each other by mutual inductance or by a second capacitor, and wherein the second combination coil has a second resonant working frequency and a second resonant isolation frequency;
   wherein the first and second resonant coils are inductively coupled to each other and respectively to the second and first resonant shields, wherein the first and second resonant working frequencies are the same, and wherein the first and second resonant isolation frequencies are such that inductive coupling between the first and second resonant coils is negated.

2. The MRI RF coil according to claim 1, wherein the first resonant coil and the first resonant shield are physically spaced from each other and are coupled by mutual inductance.

3. The MRI RF coil according to claim 1, wherein the first resonant coil is coupled to the first resonant shield by the first capacitor.

4. The MRI RF coil according to claim 1, wherein the first resonant isolation frequency is such that a voltage induced in the second resonant coil by the first resonant coil is negated by a voltage induced in the second resonant coil by the first resonant shield.

5. The MRI RF coil according to claim 1, wherein the MRI RF coil is cylindrical, and wherein the first and second combination coils are circumferentially arranged around an axis of the MRI RF coil.

6. The MRI RF coil according to claim 1, wherein the first and second combination coils are nonoverlapping.

7. The MRI RF coil according to claim 1, wherein the first and second combination coils are overlapping.

8. The MRI RF coil according to claim 1, further comprising:
   a third combination coil comprising a third resonant coil and a third resonant shield, wherein the third resonant coil and the third resonant shield are coupled to each other by mutual inductance or by a third capacitor, and wherein the third combination coil has a third resonant working frequency and a third resonant isolation frequency;
   wherein the second and third resonant coils are inductively coupled to each other and respectively to the third and second resonant shields, wherein the second and third resonant working frequencies are the same, and wherein the second and third resonant isolation frequencies are such that inductive coupling between the second and third resonant coils is negated.

9. A magnetic resonance imaging (MRI) system comprising an MRI radio frequency (RF) coil, wherein the MRI RF coil comprises:
   a first combination coil comprising a first resonant coil and a first resonant shield, wherein the first resonant coil and the first resonant shield are coupled by mutual inductance or by a first coupling capacitor, wherein the first resonant coil has a first coil capacitor, and wherein the first resonant shield has a first shield capacitor; and
   a second combination coil comprising a second resonant coil and a second resonant shield, wherein the second resonant coil and the second resonant shield are electrically coupled inductively or by a second coupling capacitor, wherein the second resonant coil has a second coil capacitor, and wherein the second resonant shield has a second shield capacitor;
   wherein the first and second combinations coils share a common resonant frequency, wherein the first coil and shield capacitors are tuned so voltages induced in the second resonant coil respectively by the first resonant coil and the first resonant shield negate each other, and wherein the second coil and shield capacitors are tuned so voltages induced in the first resonant coil respectively by the second resonant coil and the second resonant shield negate each other.

10. The MRI system according to claim 9, wherein the first resonant coil and the first resonant shield are coupled by the first coupling capacitor, and wherein the first coupling capacitor is further tuned so voltages induced in the second resonant coil respectively by the first resonant coil and the first resonant shield negate each other.

11. The MRI system according to claim 9, wherein the first resonant coil and the first resonant shield are loop shaped and extend laterally around individual axes, and wherein the individual axes border and are substantially parallel to each other.

12. The MRI system according to claim 9, wherein the first resonant coil and the first resonant shield are saddle shaped.

13. The MRI system according to claim 9, wherein the first resonant coil and the first resonant shield are birdcage shaped.

14. The MRI system according to claim 9, wherein the first combination coil has a first combination resonant frequency and a second combination resonant frequency, wherein the first and second combination resonant frequencies are defined collectively by the first resonant coil and the first resonant shield, and wherein the first and second combination resonant frequencies are different than individual resonant frequencies respectively of the first resonant coil and the first resonant shield.

15. The MRI system according to claim 9, further comprising:
an MRI scanner comprising a basic field magnet, wherein the MRI scanner is configured to generate a $B_0$ magnetic field;
wherein the MRI RF coil is configured to apply a $B_1$ magnetic field to a target, and wherein the $B_1$ magnetic field is transverse to the $B_0$ magnetic field.

16. The MRI system according to claim 9, further comprising:
an MRI scanner comprising a basic field magnet, wherein the MRI scanner is configured to generate a $B_0$ magnetic field; and
a transmit coil configured to apply a $B_1$ magnetic field to a target, wherein the $B_1$ magnetic field is transverse to the $B_0$ magnetic field;
wherein the MRI RF coil is configured to receive MRI signals from the target in response to excitation by the $B_1$ magnetic field.

17. A method for magnetic resonance imaging (MRI) comprising:
providing a MRI radio frequency (RF) coil comprising a first combination coil and a second combination coil inductively coupled together, wherein each of the first and second combination coils comprises a resonant coil and a resonant shield coupled together inductively or by a capacitor, wherein each of the first and second combination coils has a first resonant frequency and a second resonant frequency, wherein the first resonant frequencies of the first and second combination coils are tuned to resonate at a working frequency, and wherein the second resonant frequencies of the first and second combination coils are tuned so that inductive coupling between the resonant coils of the first and second combination coils is negated; and
performing an MRI process on a target using the MRI RF coil as a transmit coil and/or a receive coil, wherein the MRI process excites the target with RF energy at the working frequency and generates an image of the target.

18. The method according to claim 17, wherein the providing comprises:
tuning the second resonant frequency of the first combination coil such that a voltage induced in the resonant coil of the second combination coil by the resonant coil of the first combination coil is negated by a voltage induced in the resonant coil of the second combination coil by the resonant shield of the first combination coil, wherein the first resonant frequency of the first combination coil is fixed at the working frequency during the tuning.

19. The method according to claim 18, wherein the resonant coil of the first combination coil is coupled to the resonant shield of the first combination coil by the capacitor of the first combination coil, and wherein the tuning comprises varying the capacitor of the first combination coil to change the second resonant frequency of the first combination coil.

20. The method according to claim 17, wherein the resonant coil of the second combination coil and the resonant shield of the second combination coil respectively have a first current and a second current during a transmit or receive mode of the MRI process, wherein the resonant coil of the first combination coil is inductively coupled to the resonant coil of the second combination coil by a first mutual inductance, wherein the resonant coil of the first combination coil is inductively coupled to the resonant shield of the second combination coil by a second mutual inductance, and wherein the providing comprises:
tuning a first ratio of the second current to the first current so the first ratio is equal to a negative of a second ratio of the first mutual inductance to the second mutual inductance.

* * * * *